US012633726B2

(12) United States Patent
Kondo et al.

(10) Patent No.: US 12,633,726 B2
(45) Date of Patent: May 19, 2026

(54) LIGHT-EMITTING ELEMENT ARRAY, OPTICAL DEVICE, OPTICAL MEASUREMENT DEVICE, AND METHOD FOR MANUFACTURING LIGHT-EMITTING ELEMENT ARRAY

(71) Applicant: FUJIFILM Business Innovation Corp., Tokyo (JP)

(72) Inventors: Takashi Kondo, Kanagawa (JP);
Michiaki Murata, Kanagawa (JP);
Junichiro Hayakawa, Kanagawa (JP);
Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1061 days.

(21) Appl. No.: 17/727,798

(22) Filed: Apr. 24, 2022

(65) Prior Publication Data

US 2023/0033889 A1 Feb. 2, 2023

(30) Foreign Application Priority Data

Jul. 27, 2021 (JP) ................................. 2021-122301
Nov. 29, 2021 (JP) ................................. 2021-193388

(51) Int. Cl.
*H01S 5/22* (2006.01)
*H01S 5/02326* (2021.01)
(Continued)

(52) U.S. Cl.
CPC ........ *H01S 5/2202* (2013.01); *H01S 5/02326* (2021.01); *H01S 5/026* (2013.01);
(Continued)

(58) Field of Classification Search
CPC .... H01S 5/2202; H01S 5/02326; H01S 5/026; H01S 5/0261; H01S 5/18313; H01S 5/423; G01S 7/4815
See application file for complete search history.

(56) References Cited

U.S. PATENT DOCUMENTS

| | | |
|---|---|---|
| 10,250,012 B2 | 4/2019 | Barve et al. |
| 10,451,993 B2 | 10/2019 | Kondo |
| 10,468,853 B2 | 11/2019 | Kondo |

(Continued)

FOREIGN PATENT DOCUMENTS

| | | |
|---|---|---|
| CN | 112821190 | 5/2021 |
| JP | 6245319 | 12/2017 |

(Continued)

OTHER PUBLICATIONS

"Office Action of Japan Counterpart Application", issued on Jun. 17, 2025, with English translation thereof, p. 1-p. 5.

*Primary Examiner* — Yuanda Zhang
(74) *Attorney, Agent, or Firm* — JCIPRNET

(57) ABSTRACT

A light-emitting element array includes a substrate, plural light-emitting elements arranged on the substrate, plural constriction grooves being provided in a periphery of each of the plural light-emitting elements, and forming a current constriction layer that constricts a current flowing through a light-emitting layer by oxidizing the light-emitting layer, and a block separation portion that is formed so as to overlap a part of the plural constriction grooves in plan view, and separates the plural light-emitting elements into plural blocks.

19 Claims, 24 Drawing Sheets

RELATIONSHIP BETWEEN BLOCK SEPARATION GROOVE 53
AND TRENCH GROOVE 52

(51) Int. Cl.
    *H01S 5/026*         (2006.01)
    *H01S 5/183*         (2006.01)
    *H01S 5/42*           (2006.01)
    *G01S 7/481*         (2006.01)

(52) U.S. Cl.
    CPC ........ *H01S 5/0261* (2013.01); *H01S 5/18313* (2013.01); *H01S 5/423* (2013.01); *G01S 7/4815* (2013.01)

(56)         References Cited

U.S. PATENT DOCUMENTS

| | | | |
|---|---|---|---|
| 11,050,217 B2 | 6/2021 | Kondo et al. | |
| 2005/0169571 A1* | 8/2005 | Kaneko ................. | H10H 29/14 |
| | | | 385/14 |

| | | | |
|---|---|---|---|
| 2017/0353012 A1* | 12/2017 | Barve ..................... | H01S 5/423 |
| 2018/0080758 A1 | 3/2018 | Chen et al. | |
| 2020/0106245 A1* | 4/2020 | Barve ................. | H01S 5/18311 |
| 2021/0033708 A1* | 2/2021 | Fabiny ................. | G02B 3/0056 |
| 2021/0091535 A1 | 3/2021 | Kondo et al. | |
| 2022/0102940 A1* | 3/2022 | Sadaka ................. | H01S 5/4025 |
| 2022/0260684 A1 | 8/2022 | Kobayashi et al. | |
| 2022/0320830 A1 | 10/2022 | Aoki et al. | |
| 2022/0344909 A1* | 10/2022 | Zhu ..................... | H01S 5/04256 |

FOREIGN PATENT DOCUMENTS

| | | |
|---|---|---|
| JP | 6369613 | 8/2018 |
| JP | 2020120018 | 8/2020 |
| WO | 2020261687 | 12/2020 |
| WO | 2021020134 | 2/2021 |

* cited by examiner

ENLARGED PORTION

FIG. 5

ENLARGED PORTION

FIG. 8

RELATIONSHIP BETWEEN BLOCK SEPARATION GROOVE 53
AND TRENCH GROOVE 52

FIG. 9

CASE WHERE BLOCK SEPARATION GROOVE AND TRENCH GROOVE DO NOT OVERLAP
(COMPARATIVE EXAMPLE)

CASE WHERE BLOCK SEPARATION GROOVE 53 DOES NOT HAVE A GRID SHAPE

FIG. 11

CASE WHERE BLOCK SEPARATION GROOVE 53 IS FORMED IN LINEAR SHAPE

CASE WHERE BLOCK SEPARATION GROOVE 53 IS CURVED ALONG POSITION OF LIGHT-EMITTING ELEMENT 50 AND CASE WHERE BLOCK SEPARATION GROOVE 53 AND TRENCH GROOVE 52 OVERLAP

FORM ANODE ELECTRODE 71 (S101)

FORM GATE ELECTRODE 72 (S102)

FORM n-GATE LAYER 82 AND p-GATE LAYER 83 (S103)

FIG. 18

FORM TRENCH GROOVE 52 (S104)

81
82
83
84
91
92
94
95
60

71

52

52

GaAs SUBSTRATE

FIG. 19

ETCHING PATTERN IN A CASE WHERE TRENCH GROOVE 52 IS FORMED

FORM CURRENT CONSTRICTION LAYER 93 (S105)

FORM BLOCK SEPARATION GROOVE 53 (S106)

FIG. 22
ETCHING PATTERN IN A CASE
WHERE BLOCK SEPARATION GROOVE 53 IS FORMED

FIG. 23

FORM EMISSION OPENING 51 (S107)

81
82
83
84
91
92
93
94
95
60

52
53
51
52

GaAs SUBSTRATE

FIG. 24

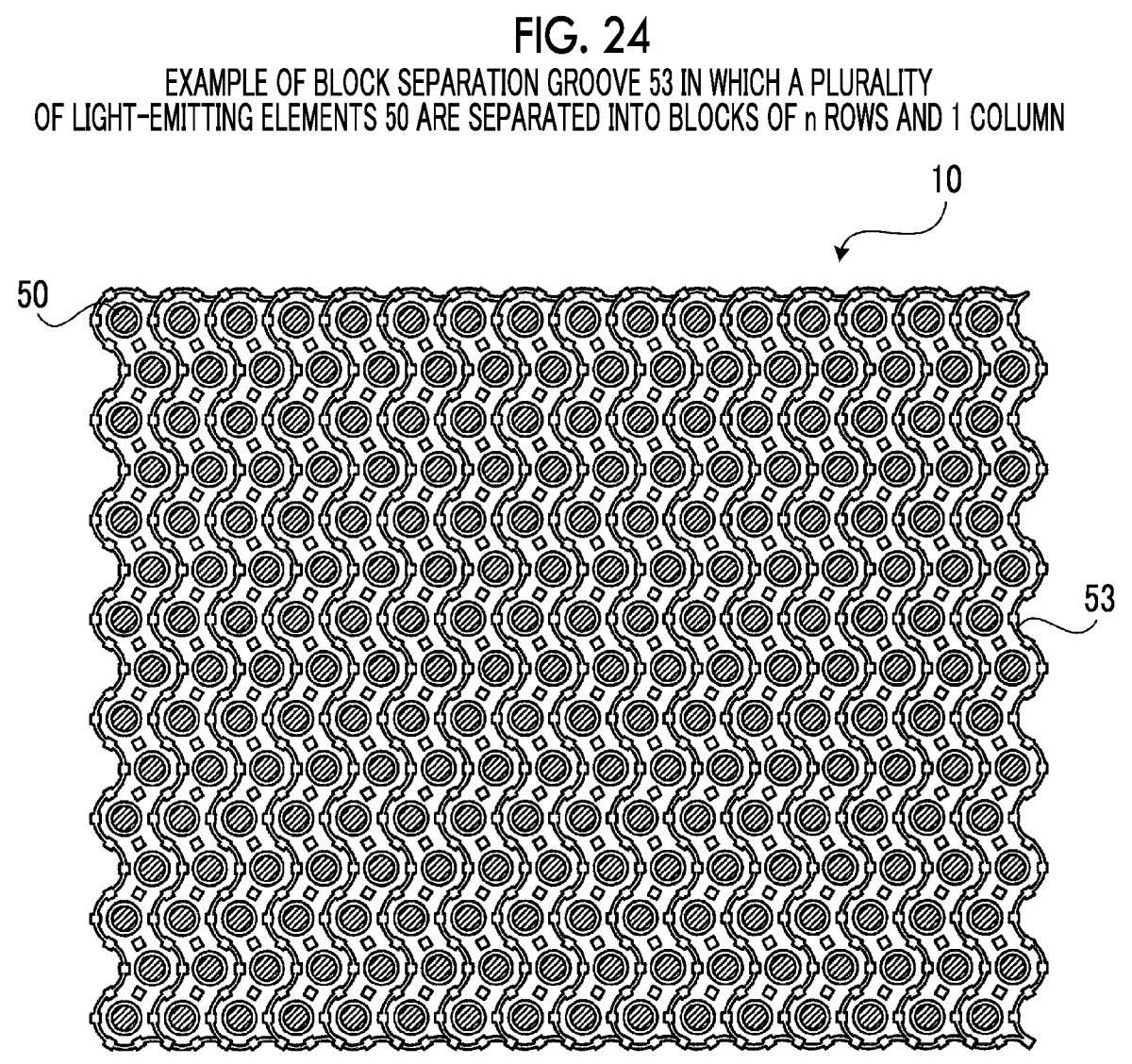

EXAMPLE OF BLOCK SEPARATION GROOVE 53 IN WHICH A PLURALITY OF LIGHT-EMITTING ELEMENTS 50 ARE SEPARATED INTO BLOCKS OF n ROWS AND 1 COLUMN

1

LIGHT-EMITTING ELEMENT ARRAY, OPTICAL DEVICE, OPTICAL MEASUREMENT DEVICE, AND METHOD FOR MANUFACTURING LIGHT-EMITTING ELEMENT ARRAY

CROSS-REFERENCE TO RELATED APPLICATIONS

This application is based on and claims priority under 35 USC 119 from Japanese Patent Application No. 2021-193388 filed Nov. 29, 2021 and No. 2021-122301 filed Jul. 27, 2021.

BACKGROUND

(i) Technical Field

The present invention relates to a light-emitting element array, an optical device, an optical measurement device, and a method for manufacturing a light-emitting element array.

(ii) Related Art

U.S. Pat. No. 10,250,012 discloses that a size of a light emitting region becomes non-uniform depending on an arrangement position between vertical cavity surface emitting lasers (VCSELs) configuring a VCSEL array.

JP6245319B discloses a light-emitting component that includes a substrate which includes a setting thyristor and on which a second semiconductor layer configuring a drive unit which drives a plurality of light-emitting elements in a state where the light-emitting elements can sequentially transition to an on state via a tunnel junction layer or a group III-V compound layer having metallic conductivity is grown on a first semiconductor stacked body configuring a laser diode which is an example of a light-emitting element, a plurality of laser diodes, and a plurality of setting thyristors.

JP6369613B discloses a light-emitting component that includes a substrate, a plurality of light-emitting diodes provided on the substrate and emitting light in a direction intersecting a surface of the substrate, and a plurality of setting thyristors which are stacked on the plurality of light-emitting diodes and drive the light-emitting diodes into a state where the light-emitting diodes can transit to an on state by being turned on, and this setting thyristor has an opening on a light path toward the setting thyristor of the light-emitting diode.

JP2020-120018A discloses a light-emitting device in which a light-emitting unit in which a plurality of light-emitting element groups each having a plurality of light-emitting elements are arrayed are sequentially set in a state where the plurality of light-emitting elements included in the light-emitting element group are arrayed and are in an emission state or a non-emission state along the array for each of the plurality of light-emitting element groups.

SUMMARY

In the light-emitting element array in which the plurality of light-emitting elements are formed, constriction grooves such as a plurality of trench grooves are provided in the periphery of each of locations where the light-emitting elements are to be configured, a current constriction layer is formed by oxidizing a light-emitting layer from inside the constriction groove, and a current flowing through the light-emitting layer is restricted to a current passing region corresponding to a position where the light-emitting element is provided.

In such a light-emitting element array, the plurality of light-emitting elements may be divided into a plurality of blocks, and light emission control may be performed in block units. In a case where the plurality of light-emitting elements are divided into blocks in this manner, a block separation portion is provided between the blocks.

Here, in a case where the block separation groove is used, the block separation groove is also oxidized rather than the constriction groove. As a result, there may be a difference between a portion that is oxidized from the block separation groove and a portion that is only oxidized from the constriction groove. In a case where the block separation groove is continuous, since an area of an oxidized portion on a side surface is greater than an area in the constriction groove, an oxidation rate is faster in the block separation groove. As a result, even though a distance between the block separation groove and the light-emitting element is the same as a distance between the constriction groove and the light-emitting element, the oxidation from the block separation groove is performed up to a region near the light-emitting element than the oxidation from the constriction groove. This may reduce the uniformity of the shape of the current passing region near the block separation portion such as the block separation groove.

Aspects of non-limiting embodiments of the present disclosure relate to a light-emitting element array, an optical device, an optical measurement device, and a method for manufacturing a light-emitting element array that are capable of suppressing non-uniformity in a shape of a current passing region provided so as to correspond to each light-emitting element by a block separation portion.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting element array including a substrate, a plurality of light-emitting elements arranged on the substrate, a plurality of constriction grooves being provided in a periphery of each of the plurality of light-emitting elements and forming a current constriction layer that constricts a current flowing through a light-emitting layer by oxidizing the light-emitting layer, and a block separation portion that is formed so as to overlap a part of the plurality of constriction grooves in plan view, and separates the plurality of light-emitting elements into a plurality of blocks.

BRIEF DESCRIPTION OF THE DRAWINGS

Exemplary embodiment(s) of the present invention will be described in detail based on the following figures, wherein:

FIG. 5 is a schematic diagram of a structure of a partially enlarged portion of the light-emitting element array 10 shown in FIG. 4;

FIG. 8 is a diagram for describing a positional relationship between a block separation groove 53 and a trench groove 52;

FIG. 9 is a diagram showing a comparative example in a case where the block separation groove 53 and the trench groove 52 are configured without overlapping;

FIG. 11 is a diagram showing an example of a case where the block separation groove 53 is configured to be linear;

FIG. 18 is a cross-sectional view after the trench groove 52 is formed in step S104;

FIG. 19 is a diagram showing an etching pattern in a case where the trench groove 52 is formed in an etching process of step S104;

FIG. 22 is a diagram showing an etching pattern in a case where the block separation groove 53 is formed in an etching process of step S106;

FIG. 23 is a cross-sectional view after an emission opening 51 is formed in step S107; and FIG. 24 is a diagram showing an example of the light-emitting element array 10 in a block division method for dividing a plurality of light-emitting elements 50 into n blocks in n rows and 1 column.

DETAILED DESCRIPTION

Next, an exemplary embodiment of the present invention will be described in detail with reference to the drawings.

Figure 1:
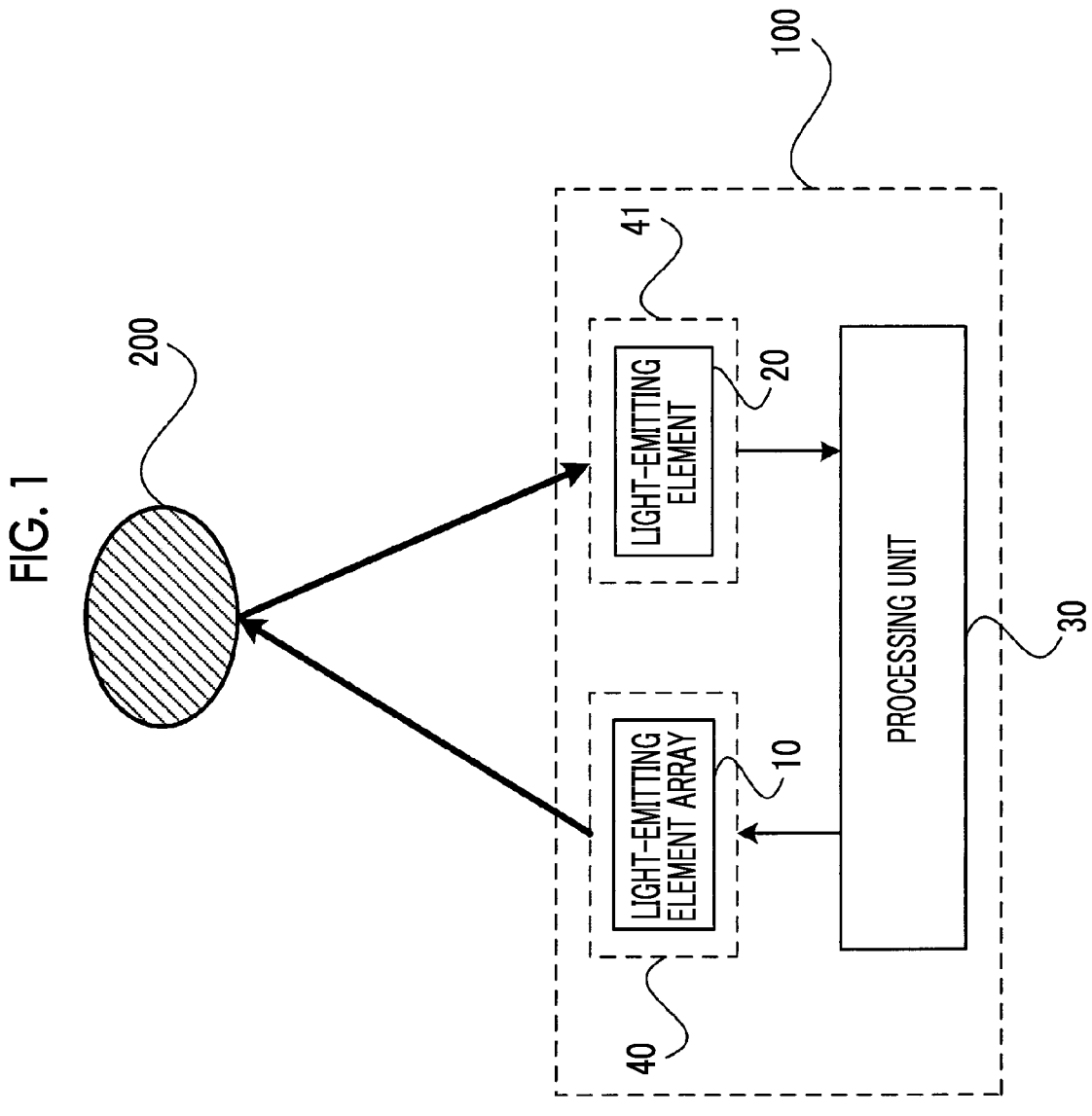
FIG. 1 is a block diagram showing a configuration of an optical measurement device 100 according to an exemplary embodiment of the present invention.

FIG. 1 is a diagram showing a configuration of an optical measurement device 100 according to the exemplary embodiment of the present invention.

The optical measurement device 100 of the present exemplary embodiment has a function of calculating a distance to a measurement target 200 such as a human or a three-dimensional shape of the measurement target 200 by irradiating the measurement target 200 with light such as infrared light and receiving reflected light thereof.

Here, the optical measurement device 100 measures the distance to the measurement target 200 from a time for the emitted light to be reflected from the measurement target 200 and returned and a speed of the light by using a technique called Time Of Flight (TOF). By such a technique, the three-dimensional shape of the measurement target 200 can be calculated by measuring distances to a plurality of points of the measurement target 200.

As shown in FIG. 1, the optical measurement device 100 of the present exemplary embodiment includes a processing unit 30, a light-emitting unit 40, and a light-receiving unit 41.

The light-emitting unit 40 includes a light-emitting element array 10 in which a plurality of light-emitting elements called vertical cavity surface emitting lasers (VCSELs) are formed. The light-emitting element array 10 performs control such that each light-emitting element is turned on, and irradiates the measurement target 200 with light from each light-emitting element.

The light-receiving unit 41 includes light-receiving element 20 that receives reflected light which is light emitted from the light-emitting element array 10 and reflected by the measurement target 200.

The processing unit 30 processes information regarding the light received by the light-receiving element 20 of the light-receiving unit 41 to measure a distance from the light-emitting element array 10 to the measurement target 200 or the shape of the measurement target 200.

As described above, for example, the optical measurement device 100 of the present exemplary embodiment can be used for various systems that measure the distance to the measurement target or the three-dimensional shape such as a system that measures a shape of a face of the human to perform face authentication by measuring the distance the measurement target 200 or the three-dimensional shape and a system that is mounted on a vehicle to detect an obstacle in the front, rear, or side of the vehicle.

In addition, a self-scanning light-emitting element array (SLED: Self-Scanning Light Emitting Device) for realizing a LED print head (LPH) used in an electrophotographic system can also be configured by using the light-emitting element array 10 of the present exemplary embodiment.

Figure 2:
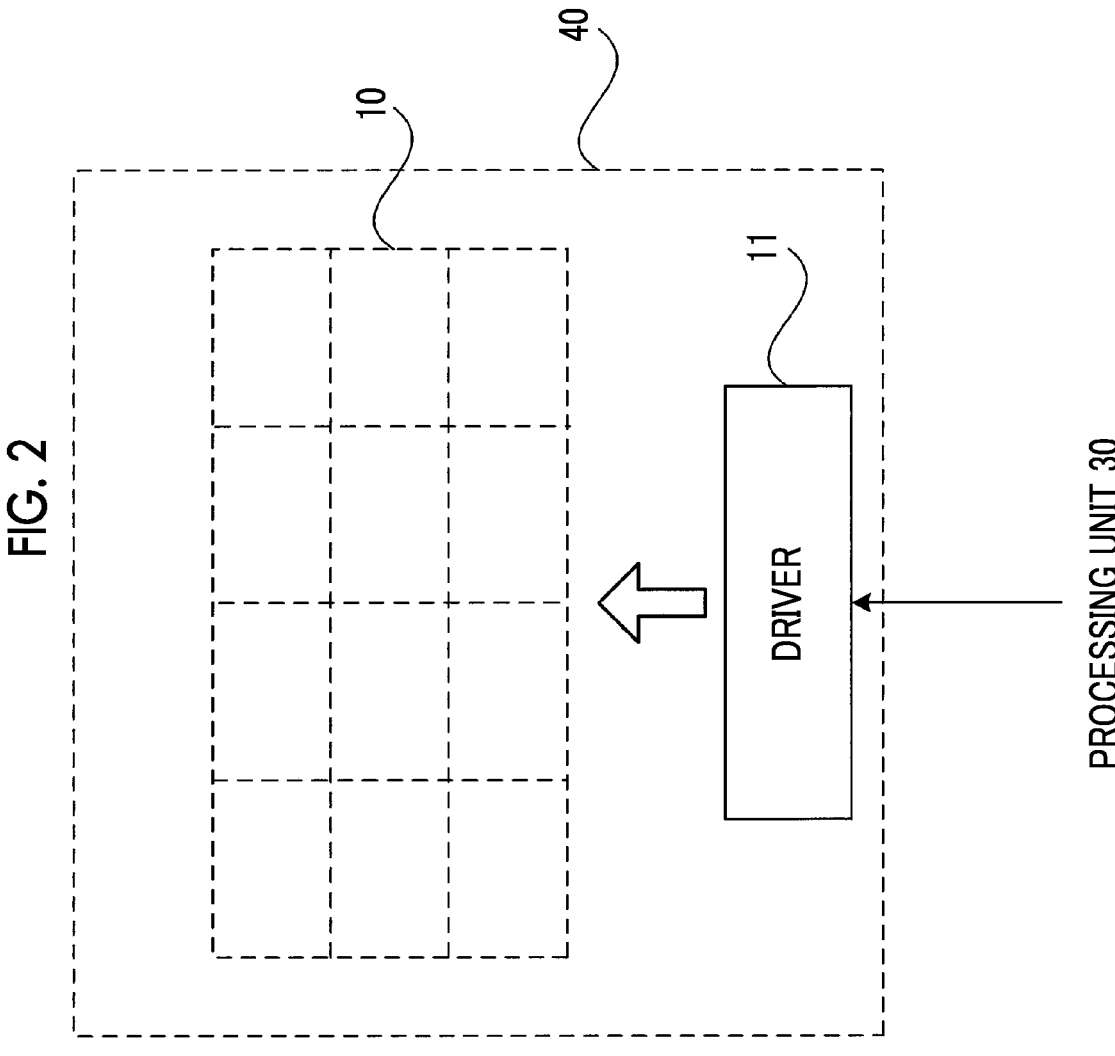
FIG. 2 is a block diagram showing a configuration of a light-emitting unit 40 in the optical measurement device 100 shown in FIG. 1.

Next, a configuration of the light-emitting unit 40 in the optical measurement device 100 shown in FIG. 1 is shown in a block diagram of FIG. 2.

As shown in FIG. 2, the light-emitting unit 40 includes the light-emitting element array 10 and a driver 11. The light-emitting element array 10 is divided into 12 blocks of 3 rows and 4 columns, for example. The driver 11 functions as a drive unit for driving a plurality of light-emitting elements configured on the light-emitting element array 10.

Figure 3:
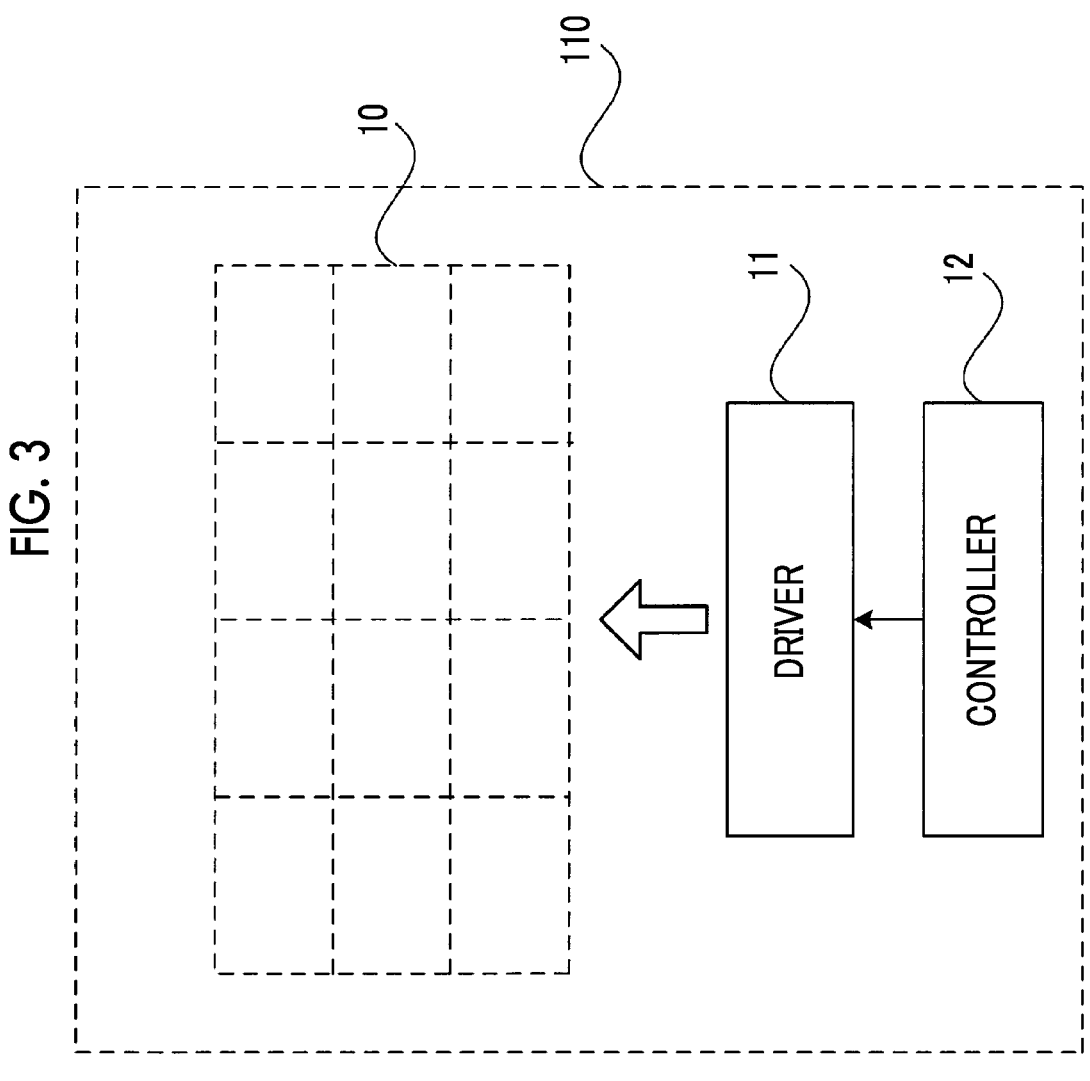
FIG. 3 is a block diagram showing a configuration of an optical device 110 according to the exemplary embodiment of the present invention.

A block diagram of FIG. 3 shows a configuration of an optical device 110 using the light-emitting element array 10 of the present exemplary embodiment.

As shown in FIG. 3, the optical device 110 according to the present exemplary embodiment includes the light-emitting element array 10, the driver 11, and a controller 12.

The controller 12 controls the driver 11 to execute processing using the light generated by the light-emitting element array 10.

Figure 4:
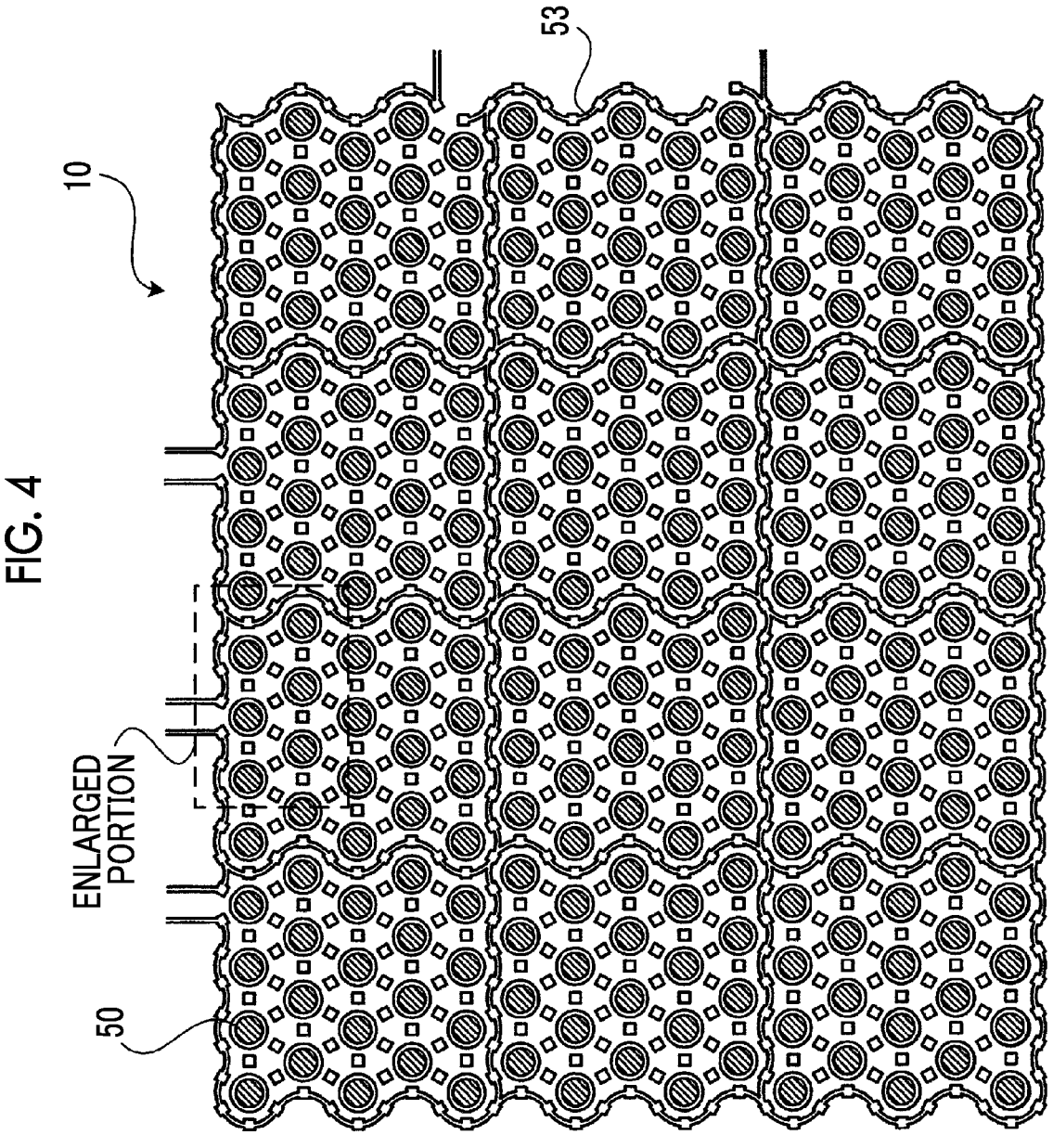
FIG. 4 is a diagram showing a schematic configuration in a case where a light-emitting element array 10 according to the exemplary embodiment of the present invention is viewed from above.

Next, FIG. 4 shows a schematic configuration in a case where the light-emitting element array 10 according to the present exemplary embodiment is viewed from above.

Referring to FIG. 4, it can be seen that the light-emitting element array 10 according to the present exemplary embodiment is configured with a plurality of light-emitting elements 50. The plurality of light-emitting elements 50 are divided into a plurality of blocks, and light emission control can be performed in block units. In the present exemplary embodiment, the plurality of light-emitting elements in the same block are connected by portions of thyristors, and the light-emitting elements in the same block can emit light at the same timing by signals sent to the thyristors. On the other hand, since there are block grooves in different blocks, the thyristors are also insulated from each other, and the light-emitting elements in different blocks do not emit light by signals sent to the thyristors in different blocks. FIG. 4 shows a case where the plurality of light-emitting elements 50 are divided into 12 blocks of 3 rows and 4 columns.

As shown in FIG. 4, in a case where the plurality of light-emitting elements 50 are divided into blocks, a block separation groove 53 is provided between the blocks, and element separation for ensuring electrical insulation between different blocks is performed. The block separation groove 53 is an example of the block separation portion according to the present exemplary embodiment.

In the present exemplary embodiment, although the blocks are electrically insulated, anode electrodes 71 and a back electrode 73 are connected. Since the thyristor portions are electrically insulated between the blocks, the blocks can emit light at different timings.

Figure 5:
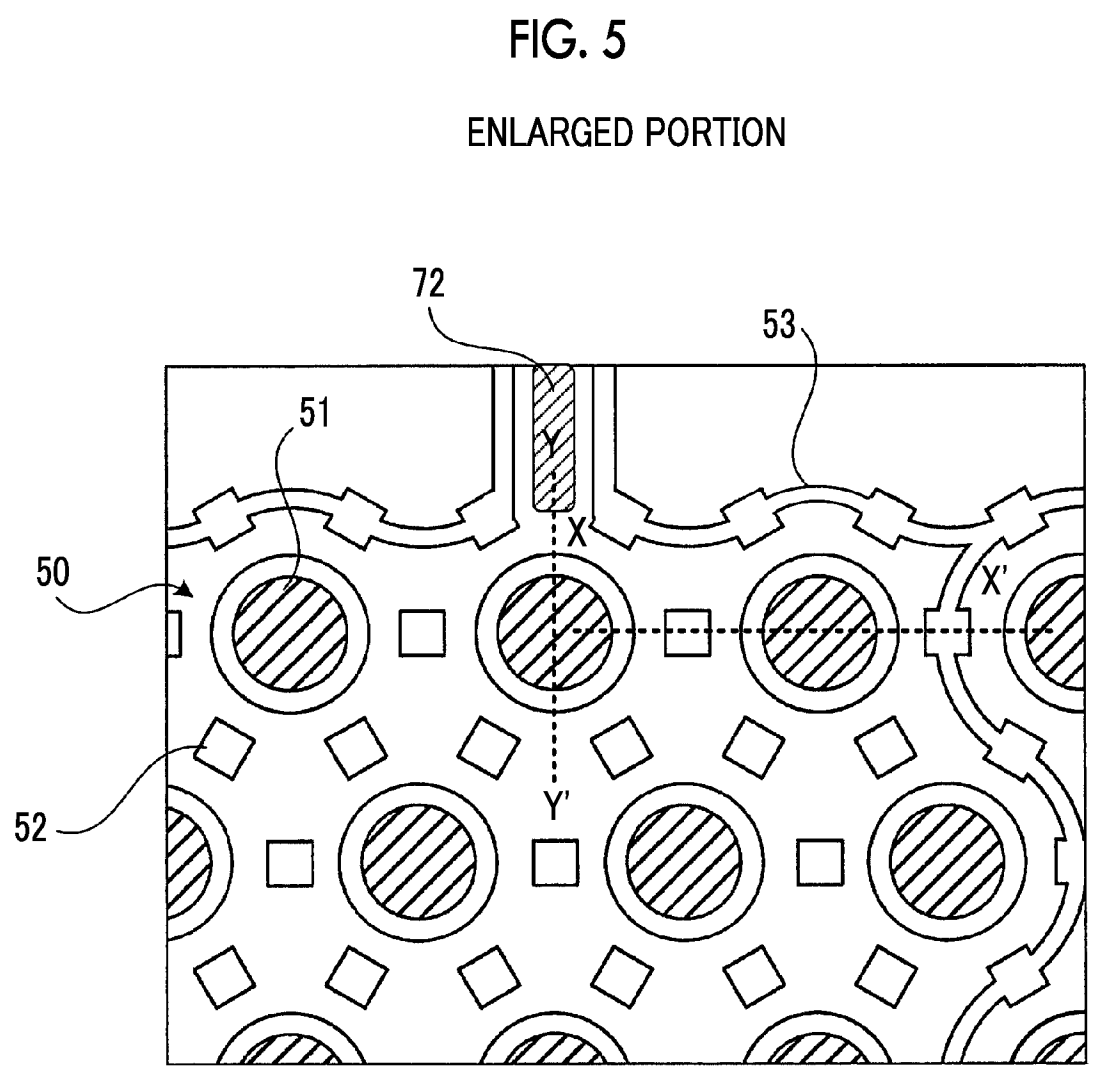

Next, FIG. 5 shows a schematic diagram of a structure of an enlarged portion of a part of the light-emitting element array 10 shown in FIG. 4.

In FIG. 5, for the sake of simplicity, the anode electrodes provided in the periphery of each light-emitting element 50 are omitted.

The light-emitting element array 10 has a semiconductor substrate to be described later and the plurality of light-emitting elements 50 arranged on the semiconductor substrate. Each light-emitting element 50 constituting the light-emitting element array 10 has an emission opening 51 for emitting a laser beam, and a plurality of trench grooves 52 are formed in the periphery of the emission opening 51.

The plurality of trench grooves 52 are provided in the periphery of each of the plurality of light-emitting elements 50, and are constriction grooves for forming a current constriction layer that constricts a current flowing through a light-emitting layer provided below the light-emitting element 50 by oxidizing the light-emitting layer.

The block separation groove 53 is formed to overlap a part of the plurality of trench grooves 52 in plan view, and is provided to separate the plurality of light-emitting elements 50 into a plurality of blocks.

Figure 6:
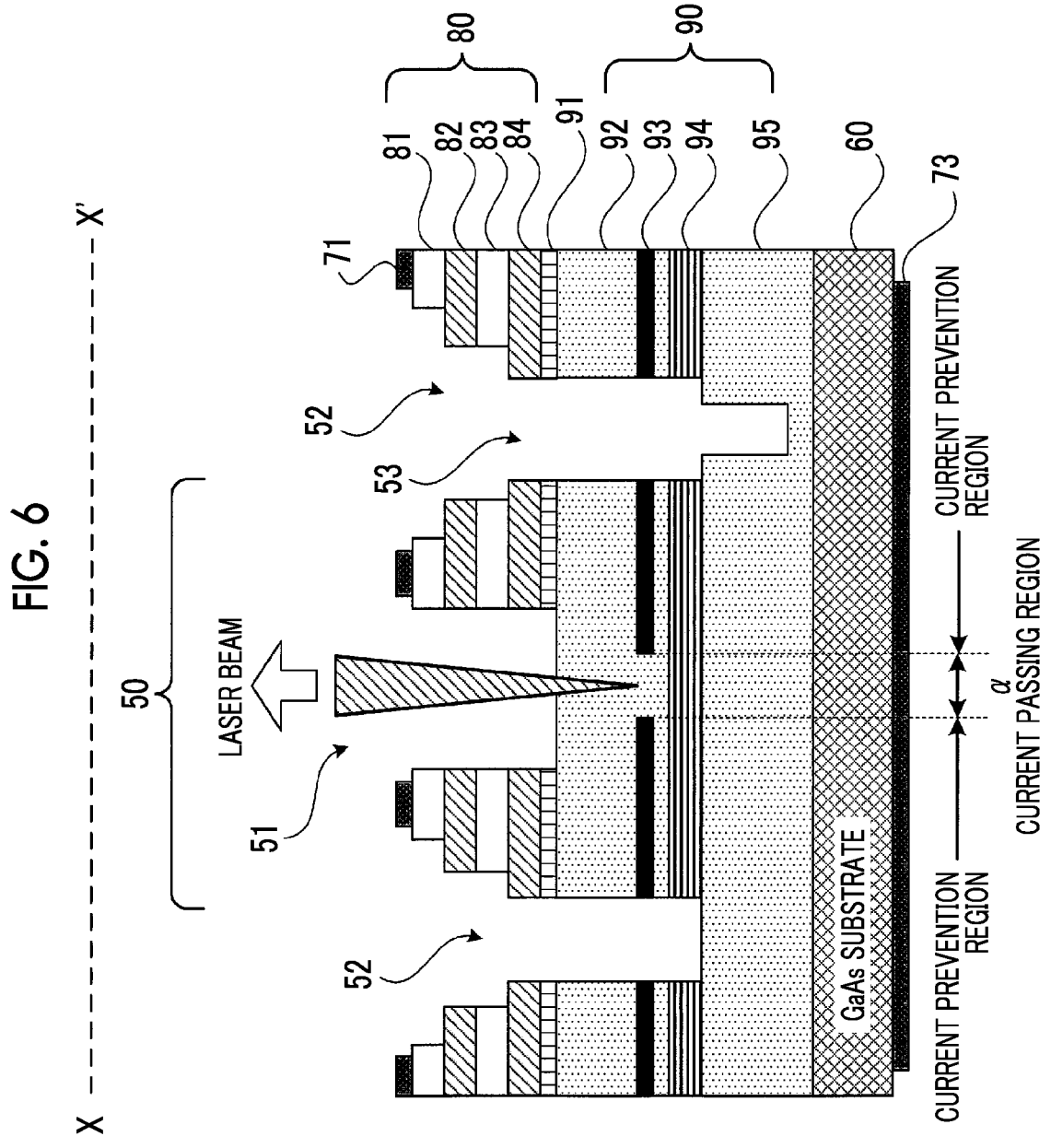
FIG. 6 is a cross-sectional view taken along line X-X' of the light-emitting element array 10 shown in FIG. 5.
Figure 7:
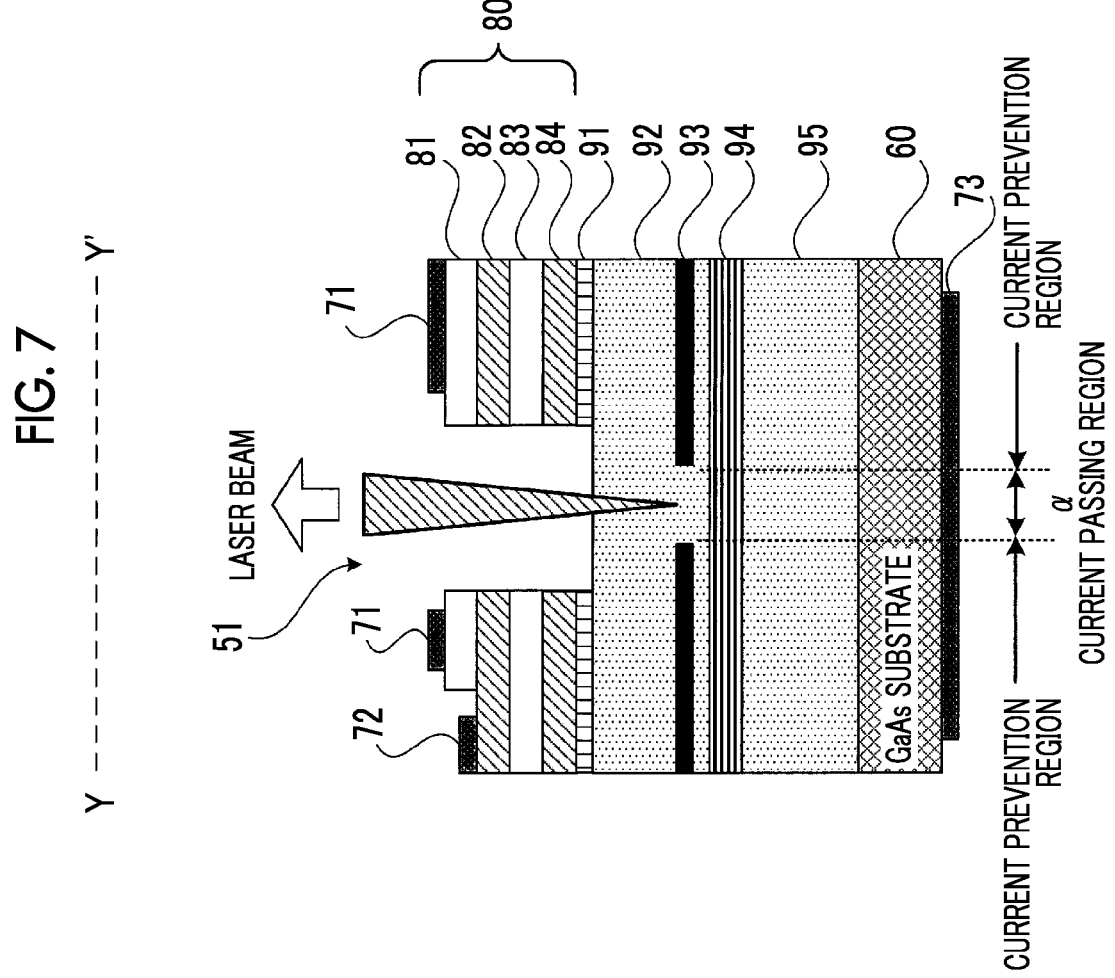
FIG. 7 is a cross-sectional view taken along line Y-Y' of the light-emitting element array 10 shown in FIG. 5.

Next, a cross-sectional view of the light-emitting element array 10 shown in FIG. 5 along line X-X' is shown in FIG. 6, and a cross-sectional view along line Y-Y' is shown in FIG. 7.

The light-emitting element array 10 of the present exemplary embodiment is configured as a surface-emitting semiconductor stacked structure using a distributed Bragg Reflector (DBR) waveguide.

As shown in FIG. 6, the light-emitting element 50 is formed on a GaAs substrate 60 which is a compound semiconductor substrate, and has a structure in which a thyristor 80 for controlling on and off of the light-emitting element 50 and a light-emitting layer 90 for generating a laser beam are combined via a tunnel junction layer 91. The back electrode 73 is formed on a back side of the GaAs substrate 60.

The thyristor 80 is configured with an anode layer 81, an n-type n-gate layer 82, a p-type p-gate layer 83, and a cathode layer 84. The light-emitting layer 90 is configured such that a p-type pDBR layer 92 and an n-type nDBR layer 95 are formed above and below a resonator 94.

The anode electrode 71 is formed on the anode layer 81 of the thyristor 80. As shown in FIG. 7, a gate electrode 72 for controlling on and off of the thyristor 80 is formed at a predetermined location of the n-gate layer 82. As described above, although the anode electrode 71 is not shown in the enlarged view shown in FIG. 5, the anode electrode 71 is actually formed so as to surround the periphery of the emission opening 51.

In the light-emitting layer 90, a laser beam is generated by resonance of light having a specific wavelength between the upper pDBR layer 92 and the lower nDBR layer 95. The laser beam generated in the light-emitting layer 90 is emitted in a vertical direction from the emission opening 51.

A current constriction layer 93 generated by oxidation is formed in a part of the pDBR layer 92. The current constriction layer 93 is formed to cause the current flowing through the light-emitting element array 10 to pass through a central portion of the light-emitting element 50 by constricting a current path of the current flowing through the light-emitting element array 10. Specifically, in the current constriction layer 93, the central portion of the light-emitting element 50 is formed as a current passing region α in which a current easily flows, and a peripheral portion thereof is formed as a current blocking region in which a current hardly flows.

Power consumed for non-emission recombination is suppressed by providing such a current constriction layer 93, and the power consumption is reduced and the emission efficiency is increased.

Here, the current constriction layer 93 is formed by oxidizing a part of the pDBR layer 92 as described above. The forming of the current constriction layer 93 by oxidizing a part of the pDBR layer 92 may be referred to as oxidative constriction. The trench grooves 52 are provided in the periphery of the light-emitting element 50 in order to oxidize the pDBR layer 92.

In the present exemplary embodiment, as shown in FIG. 5, a case where six trench grooves 52 are provided on a circle with the light-emitting element 50 as a center in the periphery where the light-emitting element 50 is arranged will be described. However, the number of trench grooves 52 provided for one light-emitting element 50 is not limited, and the structure in which 4, 5, or 8 trench grooves may be provided for one light-emitting element.

The six trench grooves 52 are formed so as to surround the periphery of the emission opening 51 and remove the cathode layer 84, the tunnel junction layer 91, the pDBR layer 92, and the resonator 94. The current constriction layer 93 is formed by oxidizing the pDBR layer 92 via the trench grooves 52.

Here, in the present exemplary embodiment, the block separation groove 53 is formed so as to overlap a part of the plurality of trench grooves 52 in plan view. Specifically, in FIG. 6, in the trench groove 52 provided on a right side of the light-emitting element 50, the trench groove 52 and the block separation groove 53 are provided so as to overlap. On the other hand, in FIG. 6, in the trench groove 52 provided on a left side of the light-emitting element 50, the trench groove 52 and the block separation groove 53 do not overlap.

In the present exemplary embodiment, after the trench groove 52 is formed by etching, the oxidative constriction in the light-emitting layer 90 is performed, and then the block separation groove 53 is formed by etching.

Thus, a portion where the trench groove 52 and the block separation groove 53 overlap is configured to be deeper than a depth of either the trench groove 52 or the block separation groove 53 in a portion where the trench groove and the block separation groove do not overlap. At the portion where the trench groove 52 and the block separation groove 53 overlap, the block separation groove is configured with a plurality of grooves having different depths.

For example, in a case where the trench groove 52 is formed at a depth of 5 μm and then the block separation groove 53 is formed at a depth of 5 μm, the depth of the block separation groove 53 is different at the portion where the trench groove 52 and the block separation groove 53 overlap is 10 μm. However, the depth is not actually a simple addition, and even under the above condition, the depth of the block separation groove 53 is, for example, about 7 μm even at the portion where the trench groove 52 and the block separation groove 53 overlap.

Here, since the block separation groove 53 is not formed yet during the oxidative constriction in the light-emitting layer 90, the light-emitting layer 90 is not oxidized from the portion of the block separation groove 53 that does not overlap the trench groove 52. As a result, the emission of the light-emitting element 50 is not influenced by the oxidation from the block separation groove 53.

The trench groove 52 and the block separation groove 53 are formed by two etching processes, respectively, and a width of the trench groove 52 is greater than a width of the block separation groove 53. As a result, as shown in FIG. 6, at the portion where the trench groove 52 and the block separation groove 53 overlap, a step narrowing from the width of the trench groove 52 to the width of the block separation groove 53 is formed.

Figure 8:
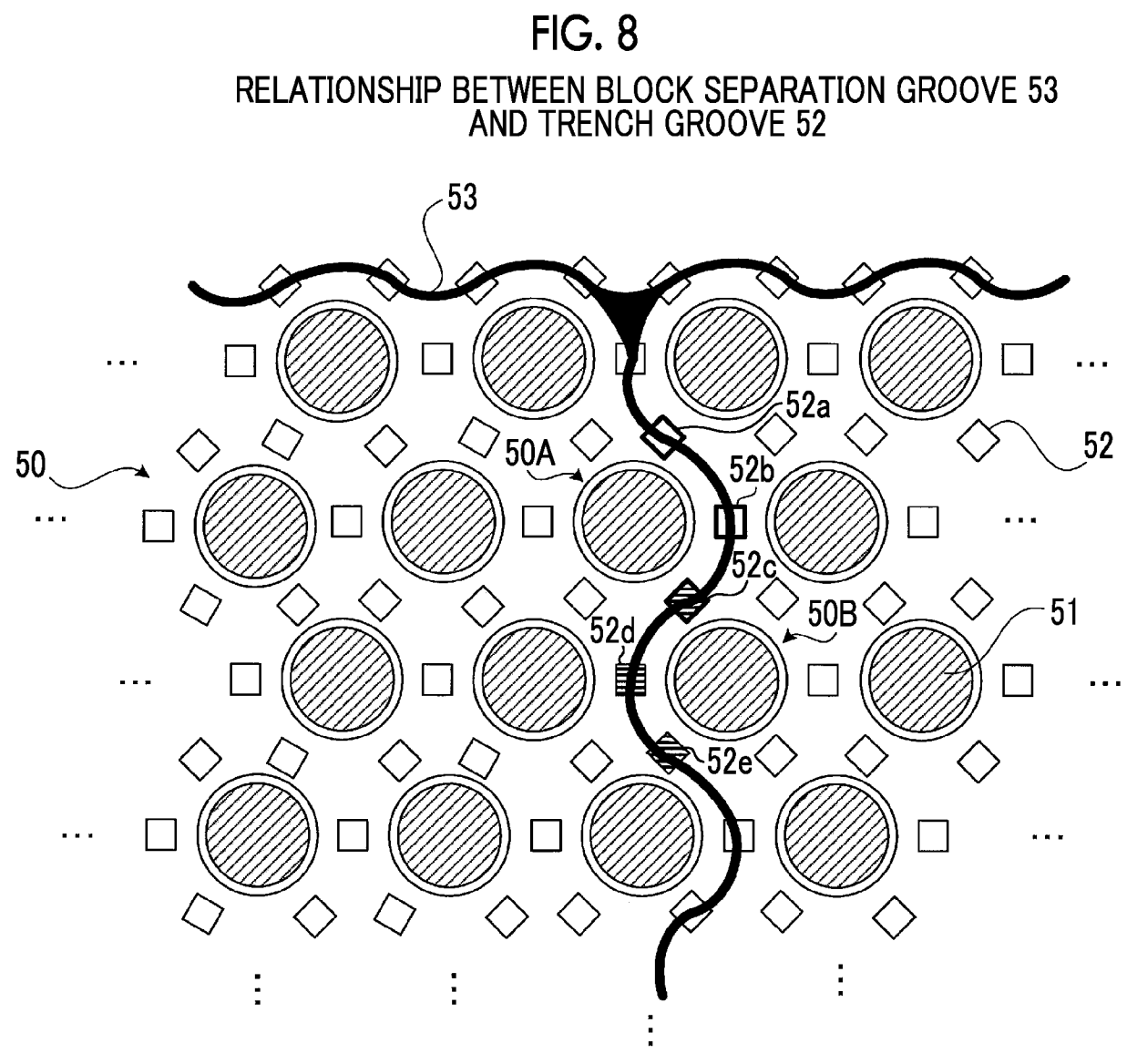

Next, a positional relationship between the block separation groove 53 and the trench groove 52 will be described with reference to FIG. 8. In FIG. 8, the block separation groove 53 is shown by a black line for the sake of clarity.

As described above, in the light-emitting element array 10 of the present exemplary embodiment, some trench grooves 52 among the plurality of trench grooves 52, specifically, the trench grooves 52 provided between two light-emitting elements 50 belonging to different blocks and the block separation groove 53 are configured to overlap.

The block separation groove 53 is configured to pass through a substantially intermediate point between two light-emitting elements 50 arranged in different blocks.

Here, substantially the intermediate point between the two light-emitting elements 50 refers that the intermediate point is positioned in a range in which a distance from one of centers of the two light-emitting elements on a straight line connecting the centers of the two light-emitting elements 50 is 45% to 55% of a distance between the two centers.

As described above, in the present exemplary embodiment, the block separation groove 53 is formed after the trench groove 52 is formed to form the current constriction layer 93. However, in a case where the trench groove 52 and the block separation groove 53 are formed in an identical etching process and a distance between the block separation groove 53 and the light-emitting element is short, the oxidative constriction in the light-emitting layer 90 is also performed in the block separation groove 53, and shapes of the current passing regions become non-uniform. Specifically, the shapes of the current passing regions become non-uniform between the light-emitting element 50 in which the block separation groove 53 is formed nearby and the light-emitting element 50 in which the block separation groove 53 is not formed nearby.

In a case where the shapes of the current passing regions become non-uniform between the light-emitting elements 50, the intensity of the laser beam to be emitted becomes non-uniform between the light-emitting elements 50.

Thus, in a case where the block separation groove 53 and the trench groove 52 are formed in the identical etching process, it is necessary to prevent the shape of the current passing region of the light-emitting element 50 from being influenced by the oxidative constriction caused by the block separation groove 53. Specifically, it is necessary to set the distance between the block separation groove 53 and the light-emitting element 50 to a predetermined distance or more.

Figure 9:
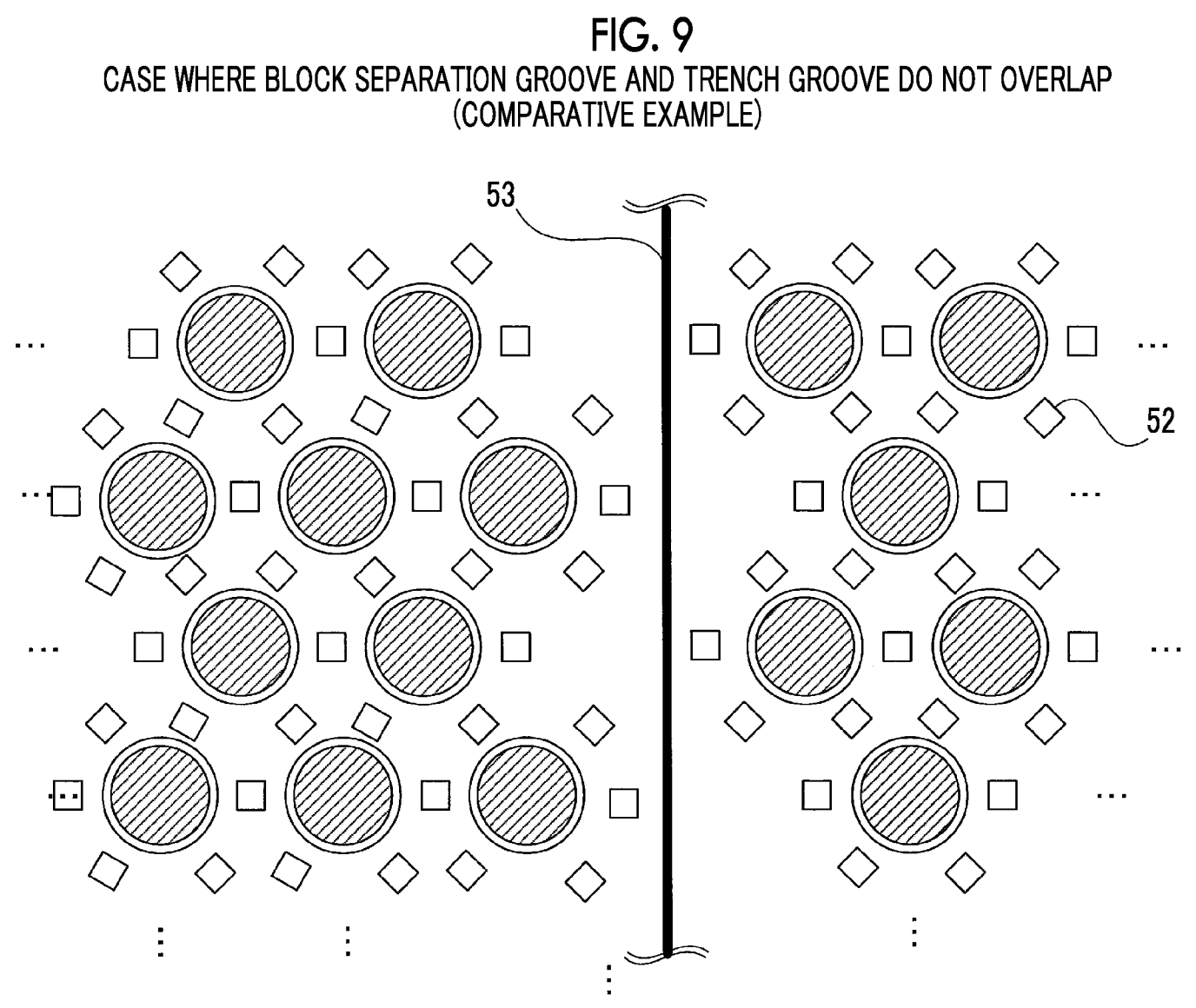

Here, FIG. 9 shows a comparative example in a case where the block separation groove 53 and the trench groove 52 are configured without overlapping.

Referring to FIG. 9, in a case where the block separation groove 53 and the trench groove 52 are configured without overlapping and the distance between the block separation groove 53 and the light-emitting element 50 is set to a predetermined distance or more, it is necessary to provide a certain region between the plurality of light-emitting elements 50 arranged in different blocks. The block separation groove 53 can be linear by providing a certain region between the plurality of light-emitting elements 50 arranged in different blocks in this manner, and it is possible to prevent non-uniformity between the light-emitting elements 50 having different shapes of the current passing regions by etching from the block separation groove 53 by setting the distance between the block separation groove 53 and each light-emitting element 50 to a predetermined distance or more.

However, in the comparative example shown in FIG. 9, the number of light-emitting elements 50 that can be formed on the semiconductor substrate having the same area is reduced by providing a certain region between the plurality of light-emitting elements 50 arranged in different blocks. As a result, the arrangement density of the light-emitting element 50 becomes low.

Thus, in the present exemplary embodiment, as shown in FIG. 8, the light-emitting elements 50 are arranged at equal intervals. In the two adjacent light-emitting elements 50, even in a case where at least one trench groove 52 of the plurality of trench grooves 52 provided in the periphery thereof is provided in common, the shapes of the current passing regions are prevented from becoming non-uniform between the light-emitting elements 50 by configuring the block separation groove 53 and the trench groove 52 so as to overlap in plan view.

The distance between the portion where the block separation groove 53 and the trench groove 52 do not overlap and the light-emitting element 50 is longer than the distance between the trench groove 52 and the light-emitting element 50. Thus, even though the light-emitting layer 90 is oxidized from the block separation groove 53, it is possible to suppress the influence on the shape of the current passing region of each light-emitting element 50.

Although FIG. 8 describes the case where the light-emitting elements 50 are arranged at equal intervals even at a boundary between different blocks, the present invention is not limited to such a configuration, and is similarly applicable to a case where the light-emitting elements 50 are not arranged at equal intervals at the boundary between the blocks.

Further, in the present exemplary embodiment, the trench groove 52 is provided in common between the two adjacent light-emitting elements 50 and the light-emitting elements 50 in the upper and lower rows, and thus, the block separation groove 53 is configured without influencing the array of the light-emitting elements 50 even in a case where the interval between the light-emitting elements 50 is shortened and the arrangement density of the light-emitting elements 50 is increased.

Specifically, as shown in FIG. 8, the block separation groove 53 is provided in a curved shape so as to include at least one inflection point in which a sign of the curvature changes along each position where the plurality of light-emitting elements 50 are arranged. Thus, it can be seen that the block separation groove 53 is configured without disturbing the array of the light-emitting elements 50 even in the case of the array in which the interval between the light-emitting elements 50 is short.

Here, in FIG. 8, the block separation groove 53 is formed along both of an array configured with three trench grooves 52a to 52c arranged along a light-emitting element 50A (indicated by a thick line in the drawing) and an array configured with three trench grooves 52c to 52e (indicated by a horizontal line in the drawing) arranged along a light-emitting element 50B. The inflection point of the block separation groove 53 is generated at a portion where a location along the array configured with the three trench grooves 52a to 52c changes to a location along the array configured with the three trench grooves 52c to 52e, that is, at a position where the trench groove 52c which is a portion where both of the two arrays overlap is arranged.

That is, the curvature of the block separation groove 53 is along the array configured with the trench grooves 52 with respect to the light-emitting element 50, and the inflection point is generated along the trench grooves 52 of the different light-emitting elements 50. The different light-emitting elements 50 are light-emitting elements 50 in different blocks from each other.

In FIG. 8, the block separation groove 53 is provided in a curved shape, and thus, the distance from the light-emitting element 50 is maintained. Even though the light-emitting layer 90 is oxidized from the block separation groove 53, it is possible to suppress the influence on the shape of the current passing region of each light-emitting element 50.

In the light-emitting element array 10 of the present exemplary embodiment, as shown in FIG. 4, the case where the block separation grooves 53 are provided in a grid shape is described.

Figure 10:
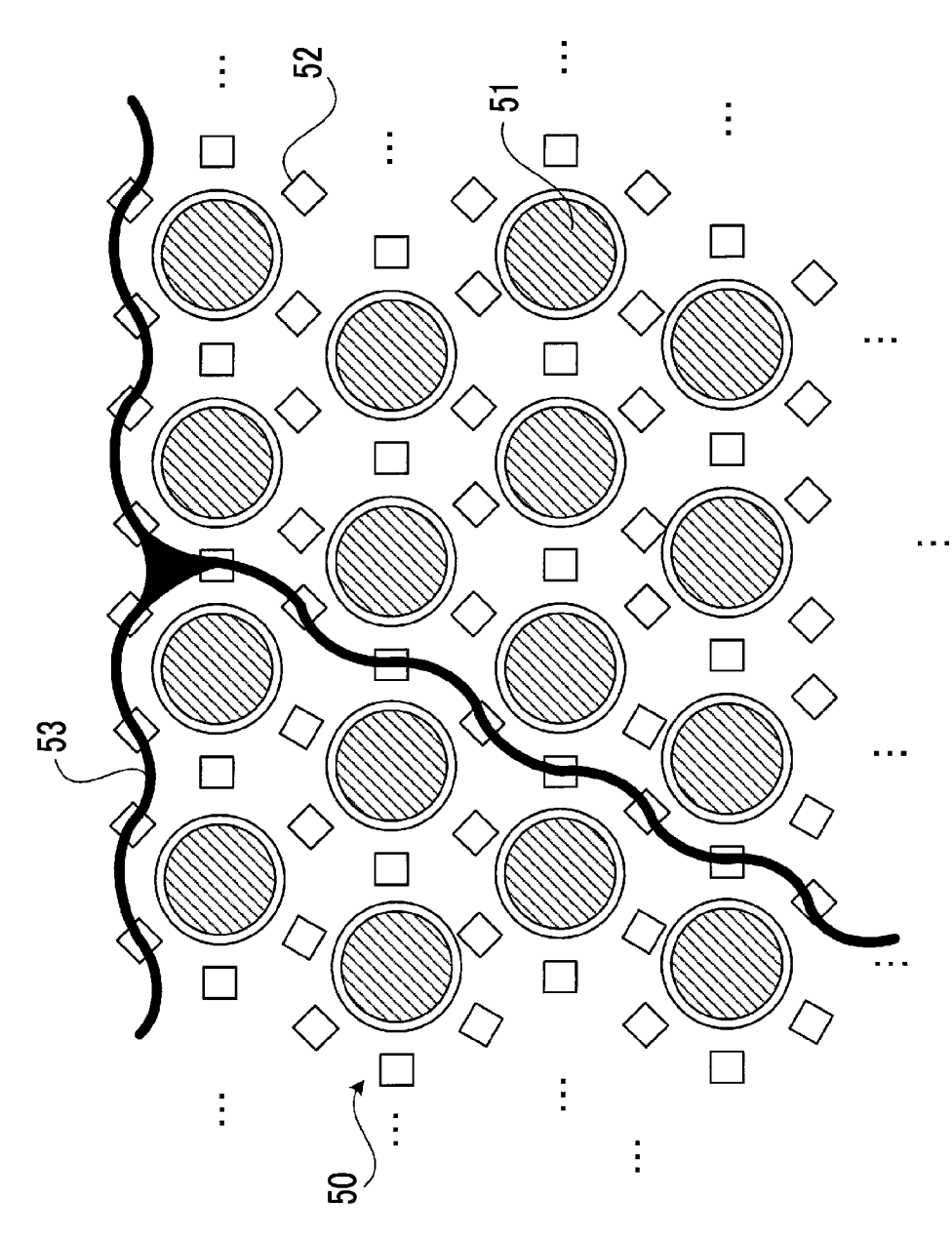
FIG. 10 is a diagram showing an example of a case where the block separation groove 53 is configured to be slanted.

However, the present invention is not limited to the case where the block separation grooves 53 are provided in the grid shape, and as shown in FIG. 10, the block separation grooves 53 can be configured to be slanted.

Figure 11:
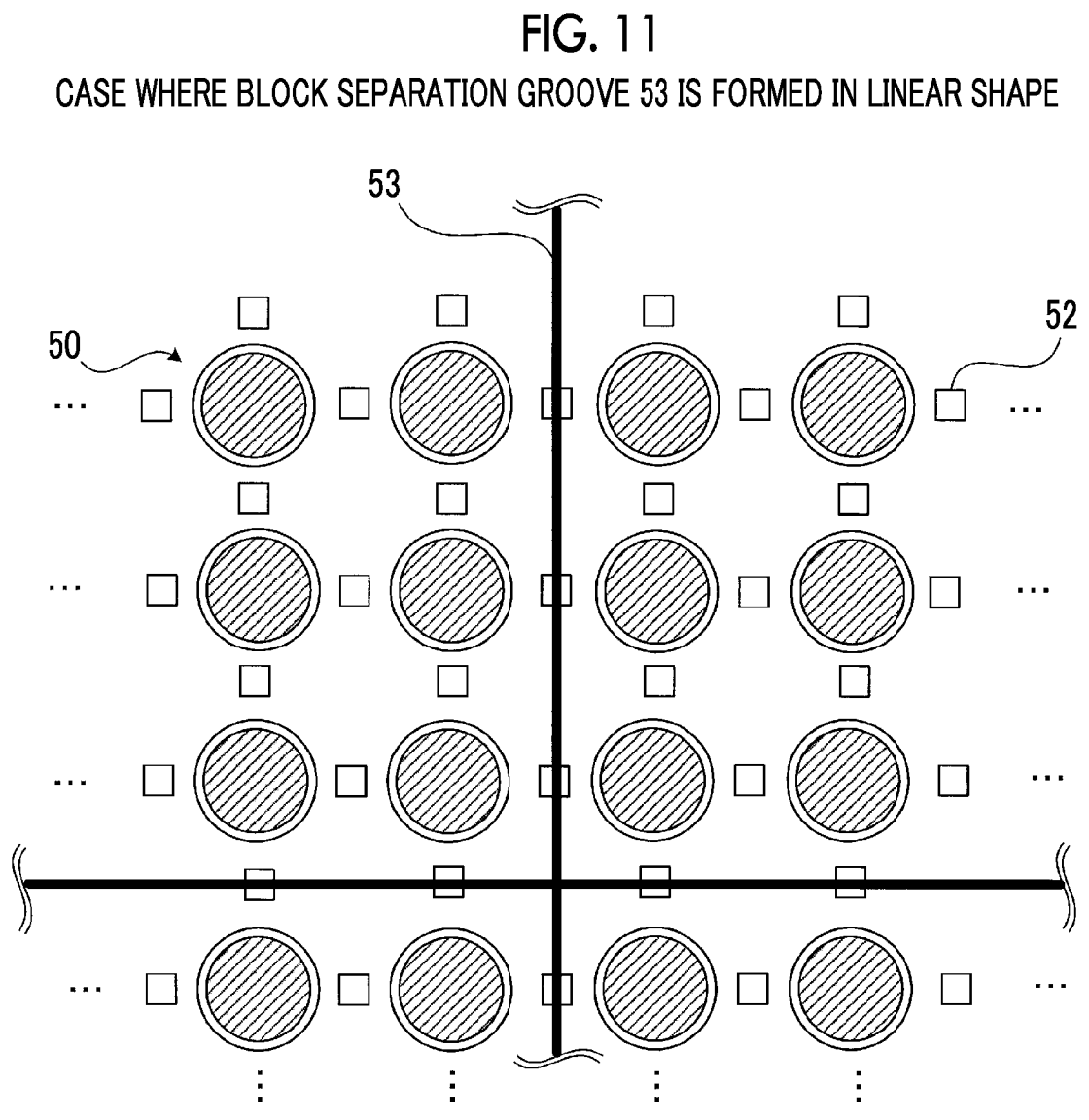

Further, the block separation groove 53 is not limited to the case where the block separation groove 53 is provided in the curved shape, and as shown in FIG. 11, the block separation groove can be configured in a linear shape. FIG. 11 shows an arrangement example in which four trench grooves are arranged in the periphery of one light-emitting element 50 and the trench grooves 52 are shared with other light-emitting elements 50 on the upper, lower, left, and right sides.

Figure 12:
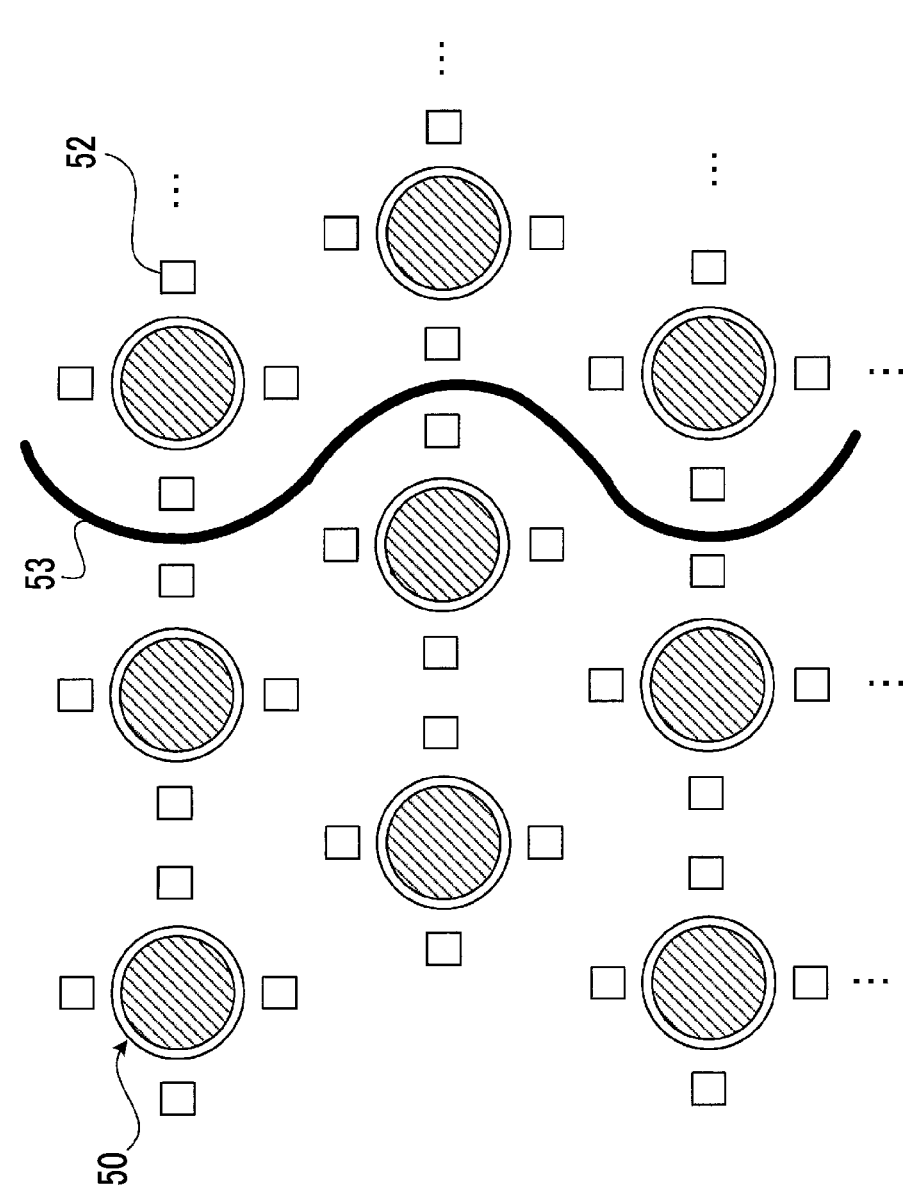
FIG. 12 is a diagram showing an example of a case where the block separation groove 53 is provided in a curved shape and the block separation groove 53 and the trench groove 52 are configured without overlapping.

Further, FIG. 12 shows an example in which the block separation groove 53 and the trench groove 52 are configured without overlapping in a case where the block separation groove 53 is provided in the curved shape.

FIG. 12 shows an arrangement example in which four trench grooves 52 are arranged in the periphery of one light-emitting element 50 and the trench grooves 52 are not shared with other light-emitting elements 50 on the upper, lower, left, and right sides. In the arrangement example shown in FIG. 12, the block separation groove 53 is configured in a curved shape along an arrangement position of the light-emitting element 50, and thus, it can be seen that the block separation groove 53 is configured without influencing the array of the light-emitting elements 50.

Although FIG. 12 describes the case where the distance between the two trench grooves 52 is the distance with which the block separation groove 53 can be formed, the distance between the two trench grooves 52 becomes shorter, and thus, the block separation groove 53 cannot be formed in some cases. In such a case, the block separation groove 53 and the trench grooves 52 are configured to overlap.

Next, a method for manufacturing the light-emitting element array 10 of the present exemplary embodiment will be described.

Figure 13:
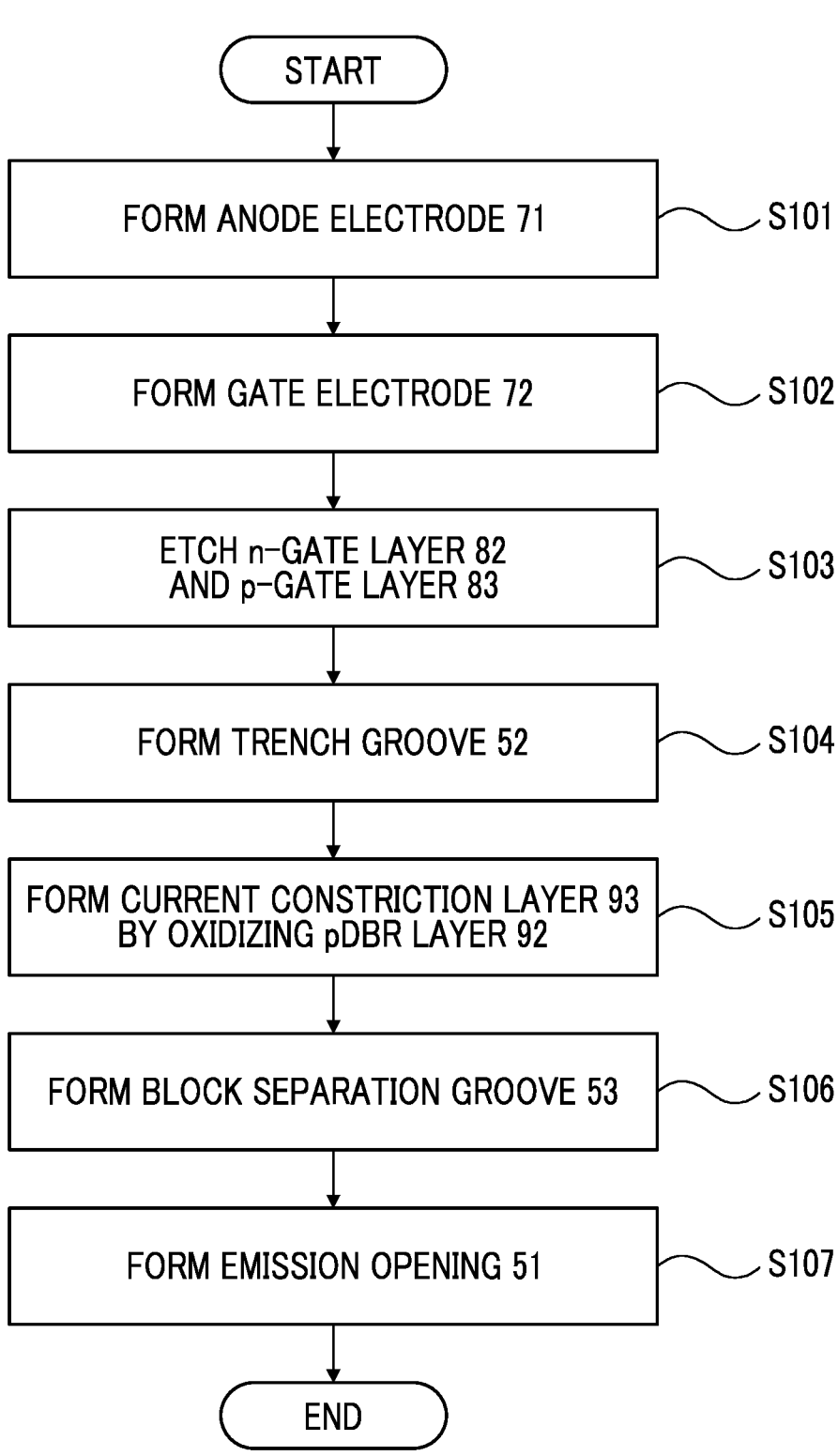
FIG. 13 is a flowchart showing an overall flow of a method for manufacturing the light-emitting element array 10 according to the exemplary embodiment of the present invention.

An overall flow of the method for manufacturing the light-emitting element array 10 of the present exemplary embodiment is shown in a flowchart of FIG. 13. Although the flowchart of FIG. 13 describes only the major processes in the method for manufacturing the light-emitting element array 10, there are some processes that are not shown in the flowchart of FIG. 13 in an actual manufacturing method.

Figure 14:
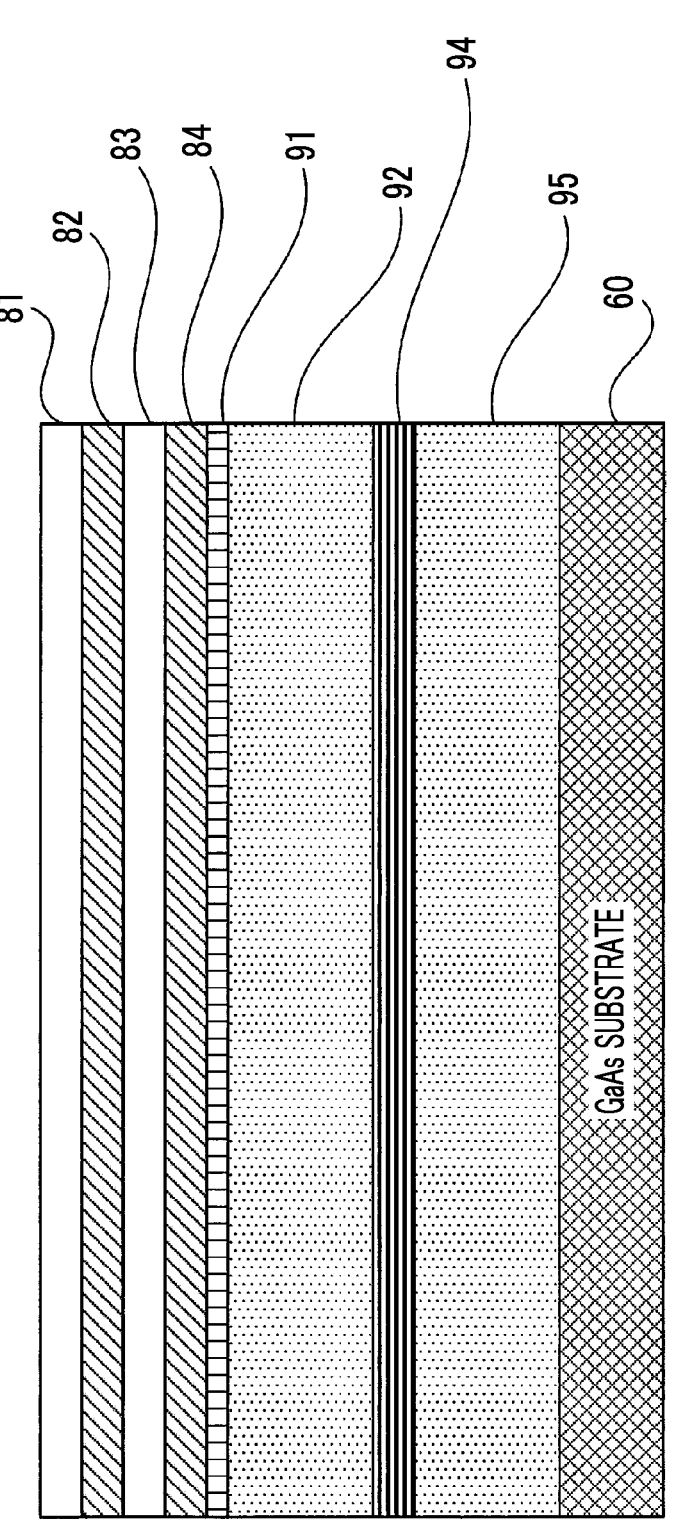
FIG. 14 is a diagram showing an example of a semiconductor stacked substrate in a state in which layers are epitaxially grown and sequentially formed on a GaAs substrate 60 in a case where the light-emitting element array 10 is manufactured.

First, in a case where the light-emitting element array 10 is manufactured, FIG. 14 shows a state where the nDBR layer 95, the resonator 94, the pDBR layer 92, the tunnel junction layer 91, the cathode layer 84, the p-gate layer 83, the n-gate layer 82, and the anode layer 81 are epitaxially grown and sequentially formed on the GaAs substrate 60.

Figure 15:
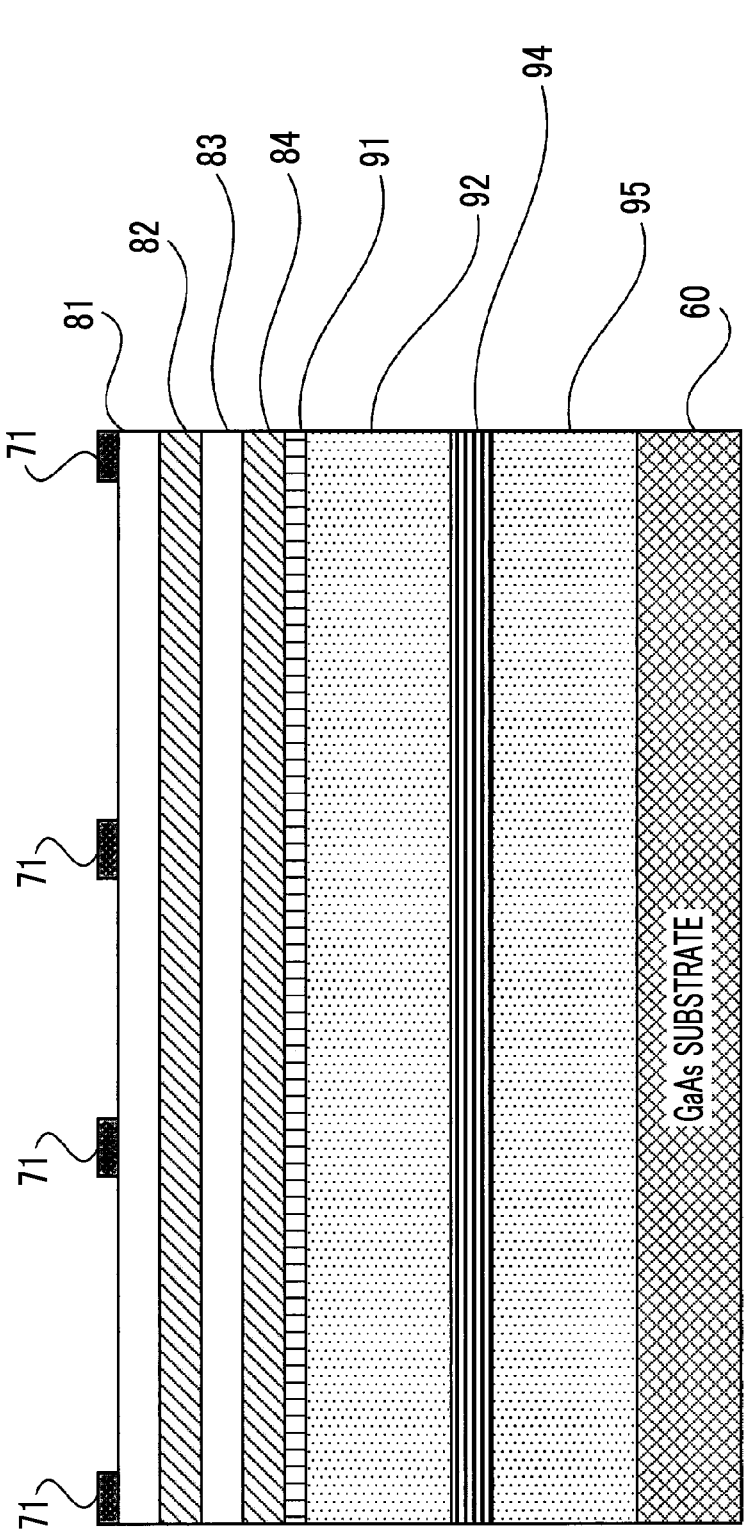
FIG. 15 is a cross-sectional view after an anode electrode 71 is formed in step S101.

First, in step S101, the anode electrode 71 is formed by depositing a metal material to become the anode electrode 71 on a semiconductor stacked substrate in a state shown in FIG. 14. FIG. 15 shows a cross-sectional view after the anode electrode 71 is formed in this manner.

Figure 16:
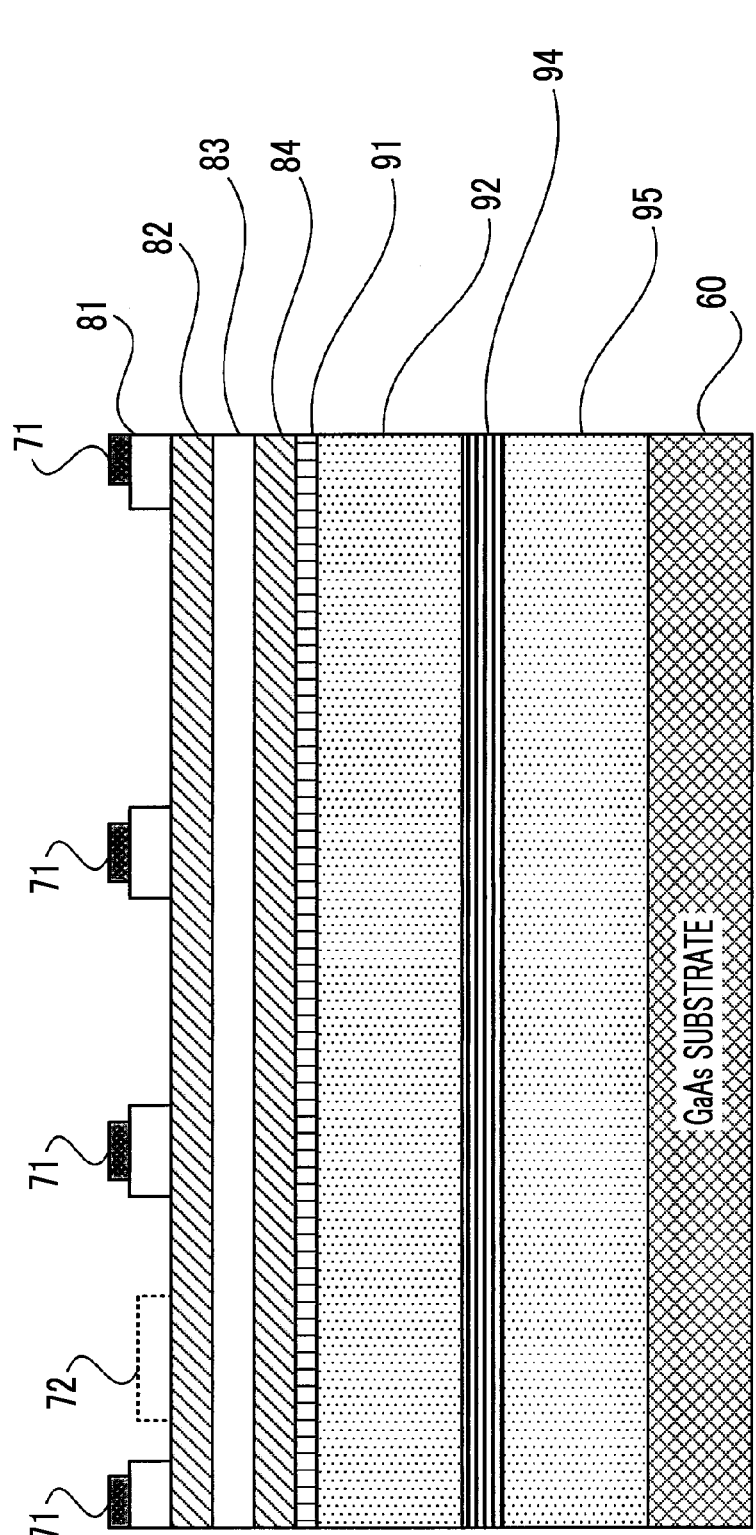
FIG. 16 is a cross-sectional view after a gate electrode 72 is formed in step S102.

Subsequently, in step S102, a gate contact is formed by etching a part of the anode layer 81, and the gate electrode 72 is formed by depositing a metal material on the formed gate contact. FIG. 16 shows a cross-sectional view after the gate electrode 72 is formed in this manner. Since the gate electrode 72 does not appear in the cross-sectional view of FIG. 16, a cross section of the gate electrode 72 is not directly shown.

Figure 17:
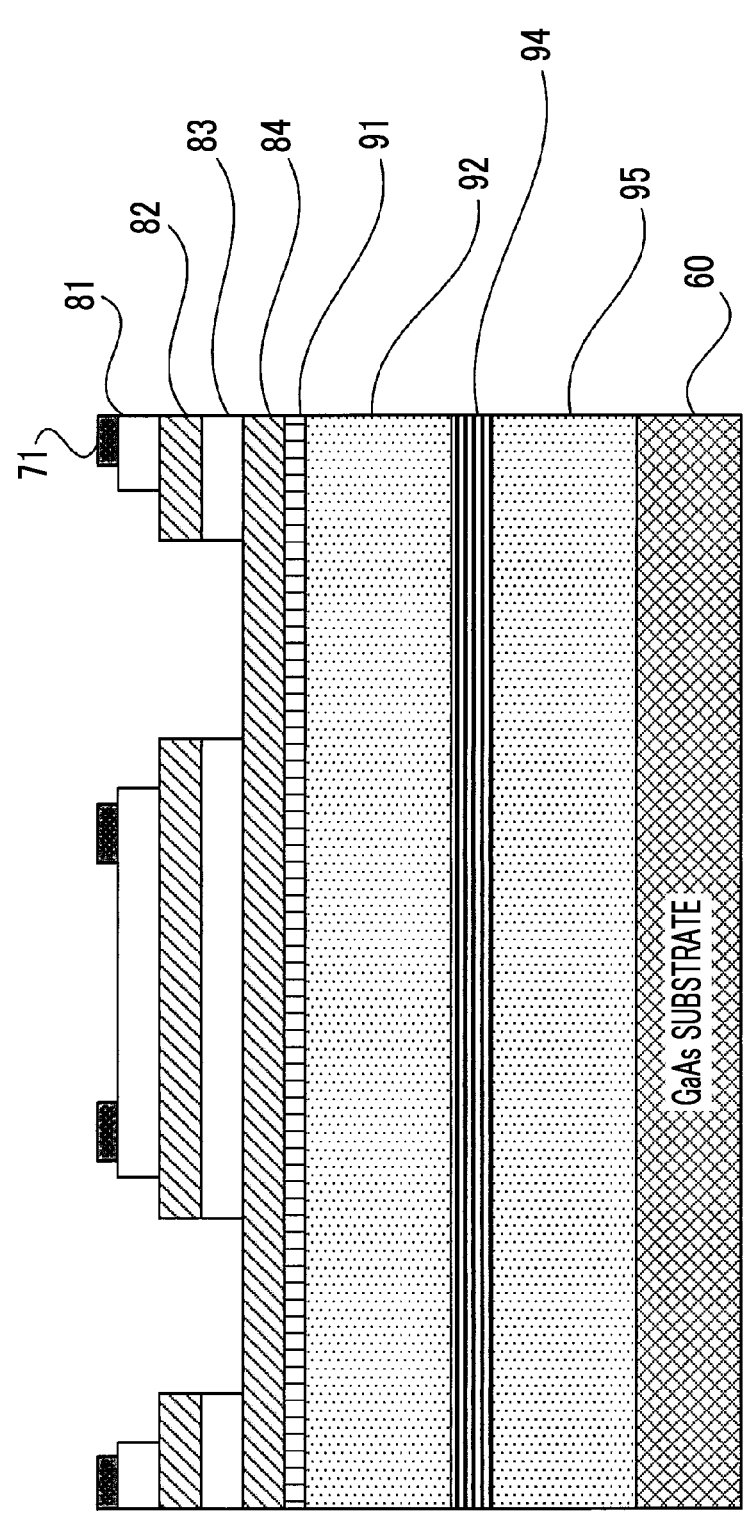
FIG. 17 is a cross-sectional view after an n-gate layer 82 and a p-gate layer 83 are removed in step S103.

Subsequently, in step S103, the n-gate layer 82 and the p-gate layer 83 in a region where the trench grooves 52 are to be formed are etched and removed. FIG. 17 shows a cross-sectional view after the n-gate layer 82 and the p-gate layer 83 are removed in this manner.

Figure 18:
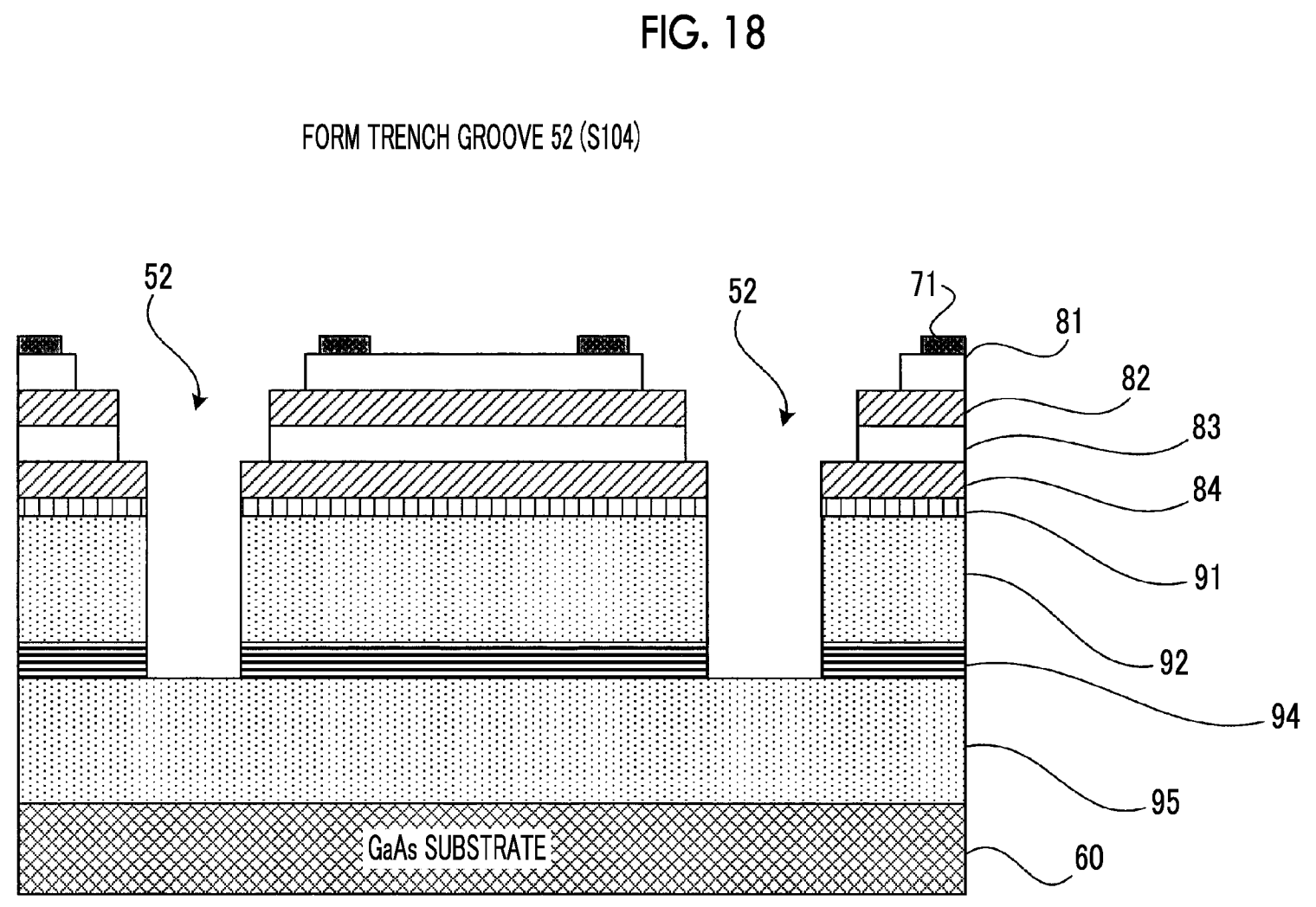

Subsequently, in step S104, a plurality of trench grooves 52 which are constriction grooves are formed in the periphery of each location where the light-emitting element 50 on the GaAs substrate 60 is to be arranged. Specifically, in the process of step S104, the trench grooves 52 are formed by removing a part of the cathode layer 84, the tunnel junction layer 91, the pDBR layer 92, and the resonator 94 by etching using an etching gas. FIG. 18 shows a cross-sectional view after the trench groove 52 is formed in this manner.

Figure 19:
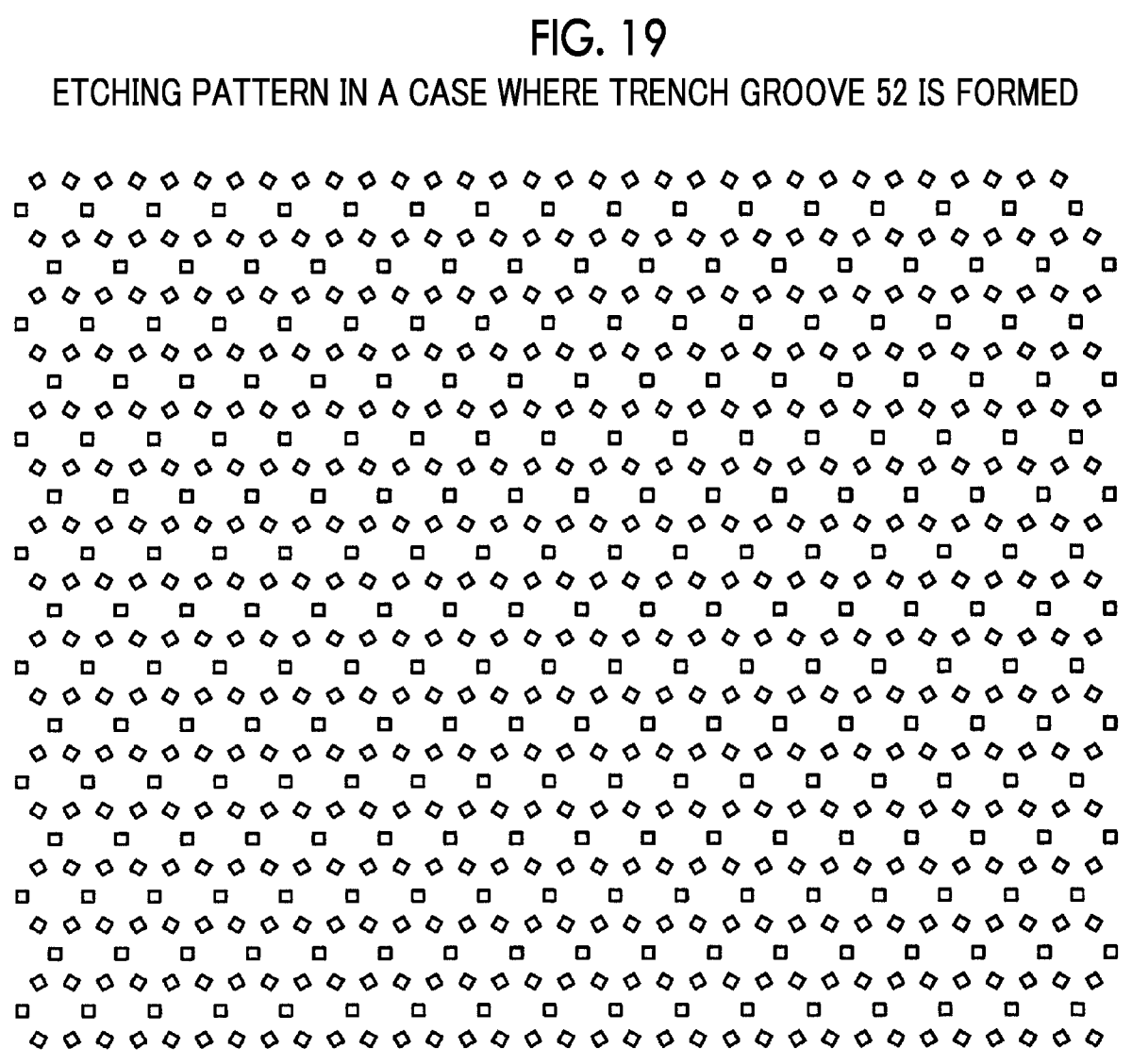

FIG. 19 shows an etching pattern in a case where the trench groove 52 is formed in the etching process of step S104.

In the cross-sectional view shown in FIG. 18, since the block separation groove 53 is not yet formed, the depths of the left and right trench grooves 52 at the location where the light-emitting element 50 is formed are the same.

Figure 20:
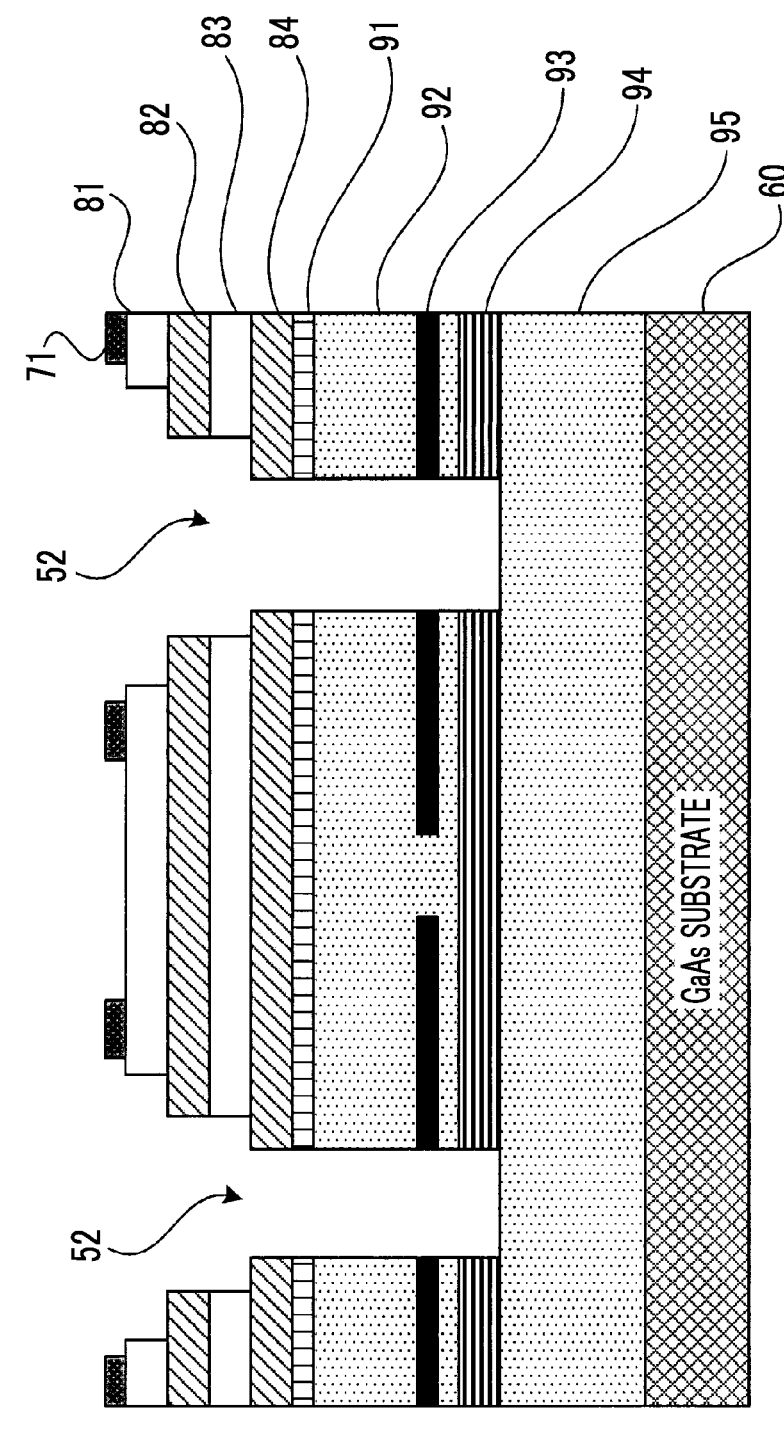
FIG. 20 is a cross-sectional view after a current constriction layer 93 is formed in step S105.

In step S105, the current constriction layer 93 that constricts the current flowing through the light-emitting layer 90 is formed by oxidizing the light-emitting layer 90 of which a part is exposed in the trench groove 52. Specifically, in the process of step S105, a part of the pDBR layer 92 is oxidized by supplying an oxidizing gas from the trench groove 52, and thus, the current constriction layer 93 is formed. FIG. 20 shows a cross-sectional view after the current constriction layer 93 is formed in this manner.

Figure 21:
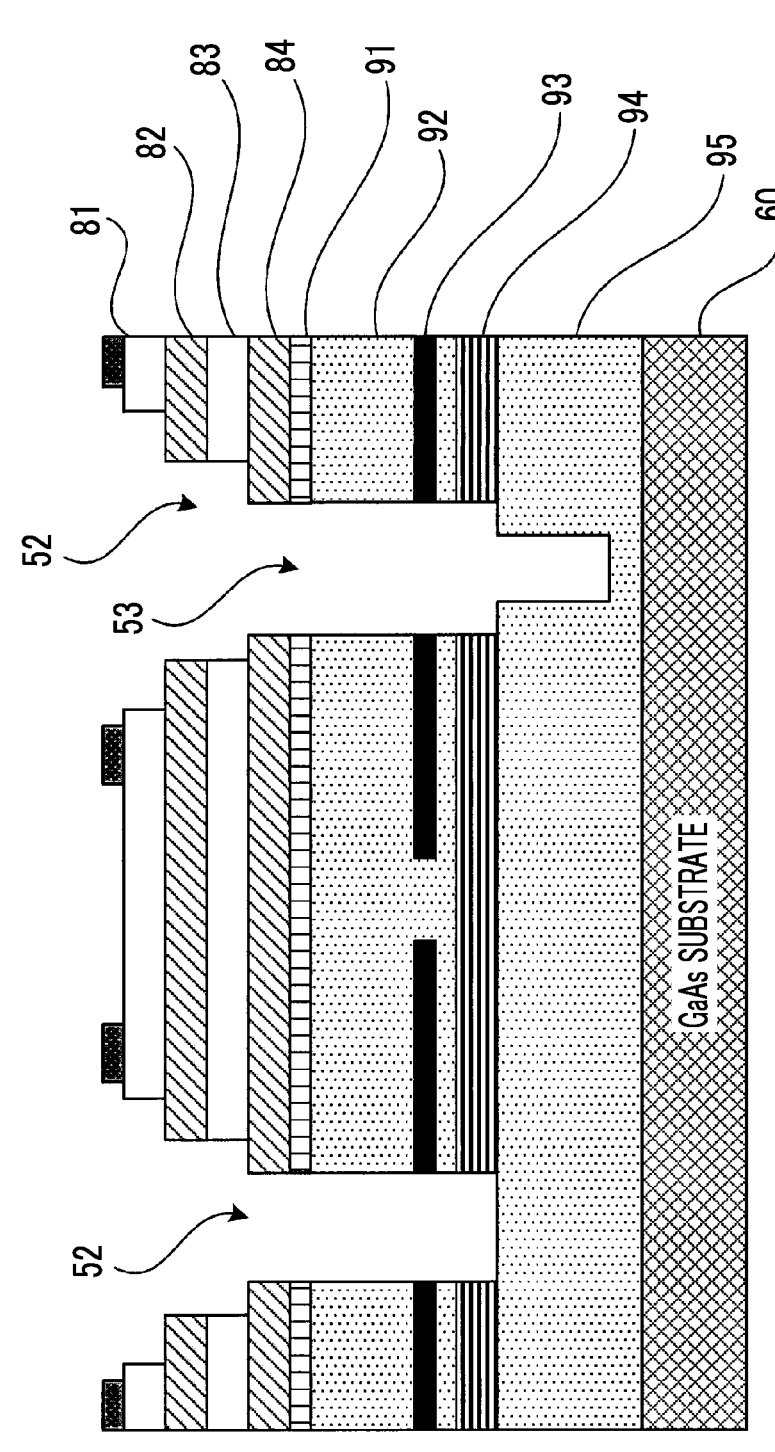
FIG. 21 is a cross-sectional view after the block separation groove 53 is formed in step S106.

Subsequently, in step S106, etching is performed by using a predetermined etching pattern, and thus, the block separation groove 53 that separates the plurality of light-emitting elements 50 to be formed into a plurality of blocks is formed. FIG. 21 shows a cross-sectional view after the block separation groove 53 is formed in this manner.

Figure 22:
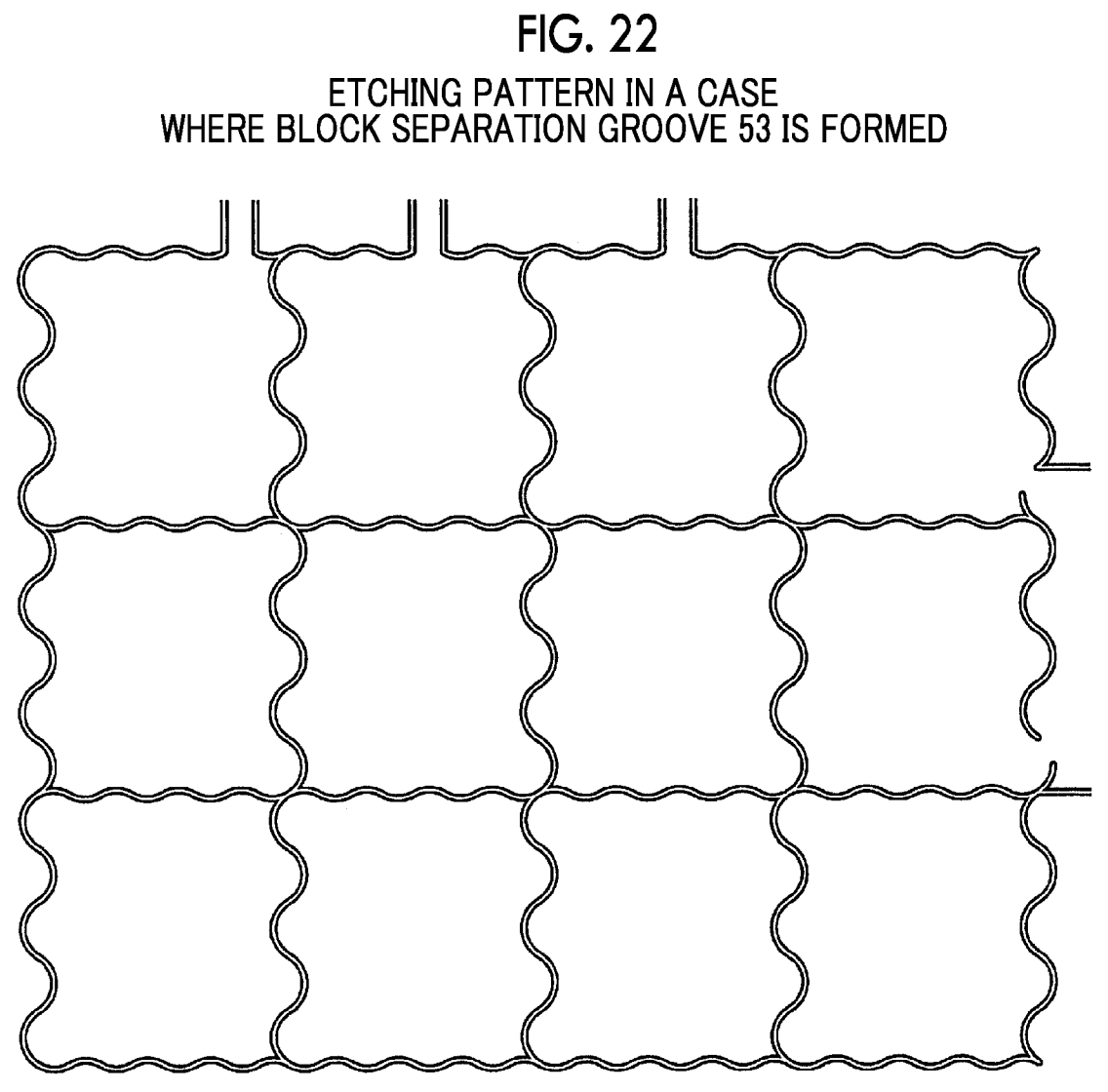

FIG. 22 shows an etching pattern in a case where the block separation groove 53 is formed in the etching process of step S106.

Referring to FIG. 21, although the block separation groove 53 is not formed in an overlapping manner in the trench groove 52 on the left side of the location where the light-emitting element 50 is formed, it can be seen that a stepped shape is formed by forming the block separation groove 53 in an overlapping manner in the trench groove 52 on the right side of the location where the light-emitting element 50 is formed.

Figure 23:
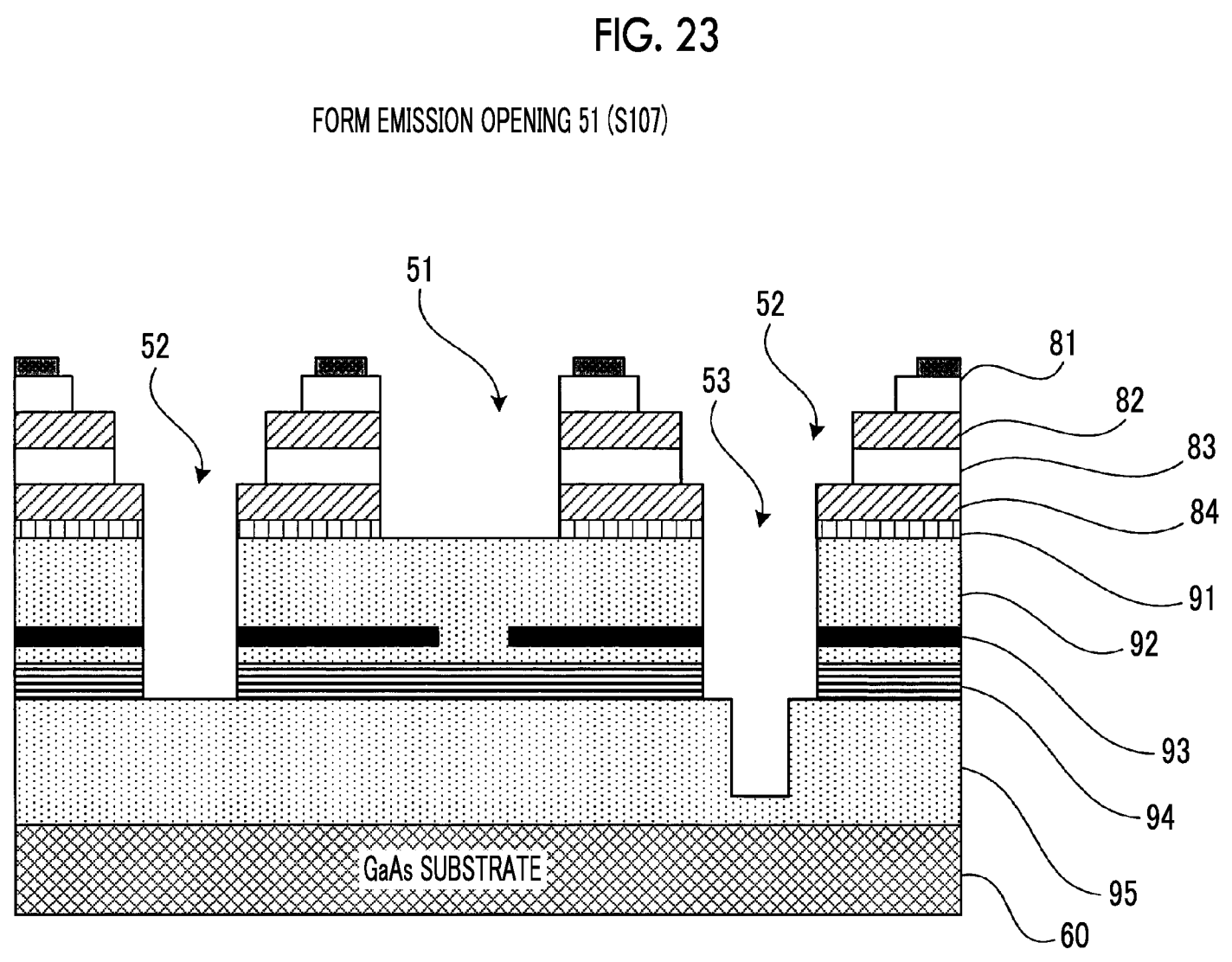

Finally, in step S107, the plurality of light-emitting elements 50 are formed by forming the emission opening 51 in the current passing region of the current constriction layer 93. Specifically, in the process of step S107, in a region in which the light-emitting elements 50 are to be formed, the emission opening 51 is formed by removing the anode layer 81, the n-gate layer 82, the p-gate layer 83, the cathode layer 84, and the tunnel junction layer 91. FIG. 23 shows a cross-sectional view after the emission opening 51 is formed in this manner.

Since only an outline of the method for manufacturing the light-emitting element array 10 of the present exemplary embodiment described above has been described, the generation of an insulating film, an electrode lead-out wiring, a protective film, a light-shielding film, and the like that are actually generated are is not described.

Finally, the back electrode 73 is formed, and thus, the light-emitting element array 10 in the state shown in FIG. 6 is formed.

Although FIG. 4 shows a case where the plurality of light-emitting elements 50 are divided into 12 blocks of 3 rows and 4 columns, the block division method is not limited to such a case. The plurality of light-emitting elements 50 may be divided by another block division method. For example, as shown in FIG. 24, it is also possible to use a block division method for dividing the plurality of light-emitting elements 50 into n blocks of n rows and 1 column.

Further, in the present exemplary embodiment, although the case where the present invention is applied to the light-emitting element array 10 having a structure in which element separation between the blocks is performed by forming the block separation groove 53 has been described, the present invention is not limited to such a case. The present invention is also applicable to a light-emitting element array having a structure in which element separation between the light-emitting elements is performed by separating the semiconductor stacked structure into a plurality of island shapes by mesa etching. Such a structure in which the semiconductor stacked structure is etched in the island shapes is also called a post structure, and in the case of a light-emitting element array having such a post structure, the periphery of each light-emitting element is removed in a continuous groove shape.

In a case where the groove formed in such a post structure is a post groove, for example, the block separation groove described above may be formed so as to overlap a part of the plurality of post grooves in plan view.

Further, in the present exemplary embodiment, the light-emitting element array 10 in which the light-emitting element and the thyristor have a layered structure may be configured not to have the thyristor. In this case, for example, the anode electrode 71 may be provided for each block such that the current is supplied to each block, and a drive unit capable of performing driving control such that the current is supplied to each block at different timings may be applied.

In the present exemplary embodiment, although an example in which the plurality of light-emitting elements are included in one block is illustrated, one block may be configured by one light-emitting element.

As another structure, a VCSEL array that emits light to a back surface of the substrate may be used, or the thyristor structure itself may be the light-emitting element. Further, the thyristor may be a transistor.

In the present exemplary embodiment, although the case where the present invention is applied to the optical measurement device is illustrated, the present invention may be applied to optical transmission in combination with a light-emitting device, an optical transmission line, and light-receiving means, and may be applied to detection of living organisms in which light emitted from the light-emitting device enters a detection target.

Further, although VCSEL is used as the light-emitting element, an LED may be used.

In the present exemplary embodiment, although the linear block separation groove in which all the grooves are connected as a line is illustrated as an example of the block separation portion, the block separation portion may be configured by a dotted-line groove. In this case, for example, a signal may not reach the adjacent block by narrowing a space between points to some extent. Instead of separating the blocks at the grooves, the block may be divided by using ion implantation to create an insulating portion at the division position of the block. In the case of the ion implantation, since there is no step due to the groove, the space between light-emitting points is narrow, and it can be applied even in a case where it is difficult to secure a size of the light-emitting point. Non-uniformity due to the presence of the block separation portion is suppressed without being oxidized from the block separation portion in the ion implantation. The separation groove and the ion implantation may be used in combination.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting element array comprising:

a substrate;

a plurality of light-emitting elements arranged on the substrate, a plurality of constriction grooves being provided in a periphery of each of the plurality of light-emitting elements and forming a current constriction layer that constricts a current flowing through a light-emitting layer by oxidizing the light-emitting layer; and a block separation portion that is formed so as to overlap a part of the plurality of constriction grooves in plan view, and separates the plurality of light-emitting elements into a plurality of blocks, wherein at least one constriction groove of the plurality of constriction grooves provided in the periphery is provided in common between two adjacent light-emitting elements and overlaps with the block separation portion, such that the part of the plurality of constriction grooves that overlaps the block separation portion in plan view comprises the at least one constriction groove provided in common between the adjacent light-emitting elements.

2. The light-emitting element array according to claim 1, wherein the block separation portion includes a block separation groove, and a portion where the constriction groove and the block separation groove overlap is configured to be deeper than a depth of either the constriction groove or the block separation groove at a portion where the constriction groove and the block separation groove do not overlap.

3. The light-emitting element array according to claim 1, wherein the light-emitting layer is not oxidized from a portion of the block separation portion that does not overlap the constriction groove.

4. The light-emitting element array according to claim 3, wherein the block separation portion includes a block separation groove, and a width of the constriction groove is greater than a width of the block separation groove, and a step narrowing from the width of the constriction groove to the width of the block separation groove is formed at a portion where the constriction groove and the block separation groove overlap.

5. The light-emitting element array according to claim 1, wherein the block separation portion includes a block separation groove, and the block separation groove is configured to pass through a substantially intermediate point between two light-emitting elements arranged in different blocks.

6. The light-emitting element array according to claim 2, wherein the block separation portion includes a block separation groove, and the block separation groove is configured to pass through a substantially intermediate point between two light-emitting elements arranged in different blocks.

7. The light-emitting element array according to claim 4, wherein the block separation portion includes a block separation groove, and the block separation groove is configured to pass through a substantially intermediate point between two light-emitting elements arranged in different blocks.

8. The light-emitting element array according to claim 1, wherein the block separation portion is provided in a curved shape so as to include at least one inflection point in which a sign of curvature changes along each of positions where the plurality of light-emitting elements are arranged.

9. The light-emitting element array according to claim 2, wherein the block separation portion is provided in a curved shape so as to include at least one inflection point in which a sign of curvature changes along each of positions where the plurality of light-emitting elements are arranged.

10. The light-emitting element array according to claim 3, wherein the block separation portion is provided in a curved shape so as to include at least one inflection point in which a sign of curvature changes along each of positions where the plurality of light-emitting elements are arranged.

11. The light-emitting element array according to claim 4, wherein the block separation portion is provided in a curved shape so as to include at least one inflection point in which a sign of curvature changes along each of positions where the plurality of light-emitting elements are arranged.

12. The light-emitting element array according to claim 5, wherein the block separation portion is provided in a curved shape so as to include at least one inflection point in which a sign of curvature changes along each of positions where the plurality of light-emitting elements are arranged.

13. The light-emitting element array according to claim 6, wherein the block separation portion is provided in a curved shape so as to include at least one inflection point in which a sign of curvature changes along each of positions where the plurality of light-emitting elements are arranged.

14. The light-emitting element array according to claim 7, wherein the block separation portion is provided in a curved shape so as to include at least one inflection point in which a sign of curvature changes along each of positions where the plurality of light-emitting elements are arranged.

15. The light-emitting element array according to claim 1, wherein the plurality of constriction grooves are provided on a circle with the light-emitting element as a center in a periphery where the light-emitting element is arranged.

16. An optical device comprising:

the light-emitting element array according to claim 1;

a drive unit that drives the plurality of light-emitting elements configured on the light-emitting element array; and a controller that controls the drive unit to execute processing using light generated by the light-emitting element array.

17. An optical measurement device comprising:

the light-emitting element array according to claim 1;

a light-receiving element that receives reflected light as light emitted from the light-emitting element array and reflected by a target; and a processing unit that processes information regarding the light received by the light-receiving element, and measures a distance to the target from the light-emitting element array or a shape of the target.

18. A method for manufacturing a light-emitting element array, comprising:

forming a plurality of constriction grooves in a periphery of each of locations where light-emitting elements on a substrate are to be arranged;

forming a current constriction layer that constricts a current flowing through a light-emitting layer of which a part is exposed within the constriction groove by oxidizing the light-emitting layer;

forming a block separation portion that separates a plurality of light-emitting elements to be formed into a plurality of blocks; and forming a plurality of light-emitting elements by forming an emission opening on a current passing region of the current constriction layers, wherein the block separation portion is formed to overlap a part of the plurality of constriction grooves in plan view, and at least one constriction groove of the plurality of constriction grooves formed in the periphery is provided in common between two adjacent light-emitting elements and overlaps with the block separation portion, such that the part of the plurality of constriction grooves that overlaps the block separation portion in plan view comprises the at least one constriction groove provided in common between the adjacent light-emitting elements.

19. The method for manufacturing a light-emitting element array according to claim 18, wherein the block separation portion includes a block separation groove, and the block separation groove is formed so as to overlap a part of a plurality of trench grooves in plan view.

\* \* \* \* \*